US012144202B2

(12) United States Patent
Matsumoto et al.

(10) Patent No.: US 12,144,202 B2
(45) Date of Patent: Nov. 12, 2024

(54) METHOD OF MANUFACTURING DISPLAY DEVICE

(71) Applicant: Japan Display Inc., Tokyo (JP)

(72) Inventors: Yuko Matsumoto, Tokyo (JP); Kaichi Fukuda, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 18/363,759

(22) Filed: Aug. 2, 2023

(65) Prior Publication Data

US 2023/0389356 A1 Nov. 30, 2023

Related U.S. Application Data

(63) Continuation of application No. 18/185,633, filed on Mar. 17, 2023.

(30) Foreign Application Priority Data

Mar. 17, 2022 (JP) ................. 2022-042742

(51) Int. Cl.
*H10K 59/12* (2023.01)
*H10K 59/122* (2023.01)
*H10K 59/35* (2023.01)
*H10K 59/80* (2023.01)

(52) U.S. Cl.
CPC ....... *H10K 59/1201* (2023.02); *H10K 59/122* (2023.02); *H10K 59/352* (2023.02); *H10K 59/873* (2023.02)

(58) Field of Classification Search
CPC ............. H10K 59/1201; H10K 59/122; H10K 59/873; H10K 59/352
See application file for complete search history.

(56) References Cited

U.S. PATENT DOCUMENTS

2003/0141808 A1 7/2003 Kobayashi
2003/0184503 A1* 10/2003 Ohshita ................. G09G 3/006
345/76
2004/0160170 A1 8/2004 Sato et al.
(Continued)

FOREIGN PATENT DOCUMENTS

JP 2000-36385 A 2/2000
JP 2000-195677 A 7/2000
(Continued)

OTHER PUBLICATIONS

English machine translation of JP 2008/135325 (Year: 2008).*
Office Action issued on Jun. 14, 2024, in corresponding Indian patent Application No. 202314017817, 5 pages.

*Primary Examiner* — Dzung Tran
(74) *Attorney, Agent, or Firm* — XSENSUS LLP

(57) ABSTRACT

According to one embodiment, in a manufacturing method of a display device, a first lower electrode, a second lower electrode and a third lower electrode are formed. A rib having first aperture overlapping the first lower electrode, a second aperture overlapping the second lower electrode, and a third aperture overlapping the third lower electrode is formed. A first thin film including a first light emitting layer is formed on the first lower electrode. A second thin film including a second light emitting layer is formed on the second lower electrode. An area of the first aperture is larger than an area of the second aperture.

18 Claims, 15 Drawing Sheets

(56) References Cited

U.S. PATENT DOCUMENTS

| | | | |
|---|---|---|---|
| 2005/0032453 A1 | 2/2005 | Tachikawa et al. | |
| 2009/0009069 A1 | 1/2009 | Takata | |
| 2012/0276484 A1 | 11/2012 | Izumi et al. | |
| 2013/0084531 A1 | 4/2013 | Hamaguchi et al. | |
| 2015/0060806 A1* | 3/2015 | Park | H10K 59/122 257/40 |
| 2015/0380685 A1* | 12/2015 | Lee | H10K 59/122 257/40 |
| 2016/0190508 A1* | 6/2016 | Nakamura | H10K 50/824 257/40 |
| 2017/0125734 A1* | 5/2017 | Lee | H10K 50/846 |
| 2018/0366524 A1* | 12/2018 | Bang | H10K 71/60 |
| 2019/0363275 A1 | 11/2019 | Ochi et al. | |

FOREIGN PATENT DOCUMENTS

| | | |
|---|---|---|
| JP | 2003-249360 A | 9/2003 |
| JP | 2003-317949 A | 11/2003 |
| JP | 2004-207217 A | 7/2004 |
| JP | 2008-135325 A | 6/2008 |
| JP | 2009-32673 A | 2/2009 |
| JP | 2010-118191 A | 5/2010 |
| JP | 2012-238580 A | 12/2012 |
| JP | 2013-84576 A | 5/2013 |
| JP | 2017-529651 A | 10/2017 |
| KR | 2013-0031099 A | 3/2013 |
| WO | 2016/019273 A1 | 2/2016 |
| WO | 2018/179308 A1 | 10/2018 |
| WO | 2020/233284 A1 | 11/2020 |

* cited by examiner

METHOD OF MANUFACTURING DISPLAY DEVICE

CROSS-REFERENCE TO RELATED APPLICATIONS

This application is a continuation of U.S. application Ser. No. 18/185,633, filed Mar. 17, 2023, which is based upon and claims the benefit of priority from Japanese Patent Application No. 2022-042742, filed Mar. 17, 2022, the entire contents of each are incorporated herein by reference.

FIELD

Embodiments described herein relate generally to a method of manufacturing a display device.

BACKGROUND

In recent years, a display device in which an organic light-emitting diode (OLED) is used as a display element has been put into practical use. The display element includes a pixel circuit including a thin-film transistor, a lower electrode connected to the pixel circuit, an organic layer covering the lower electrode, and an upper electrode covering the organic layer. The organic layer includes functional layers such as a hole-transport layer and an electron-transport layer in addition to a light emitting layer.

In the process of manufacturing such a display element, a technique for suppressing a decrease in reliability is required.

DETAILED DESCRIPTION

Figure 1:
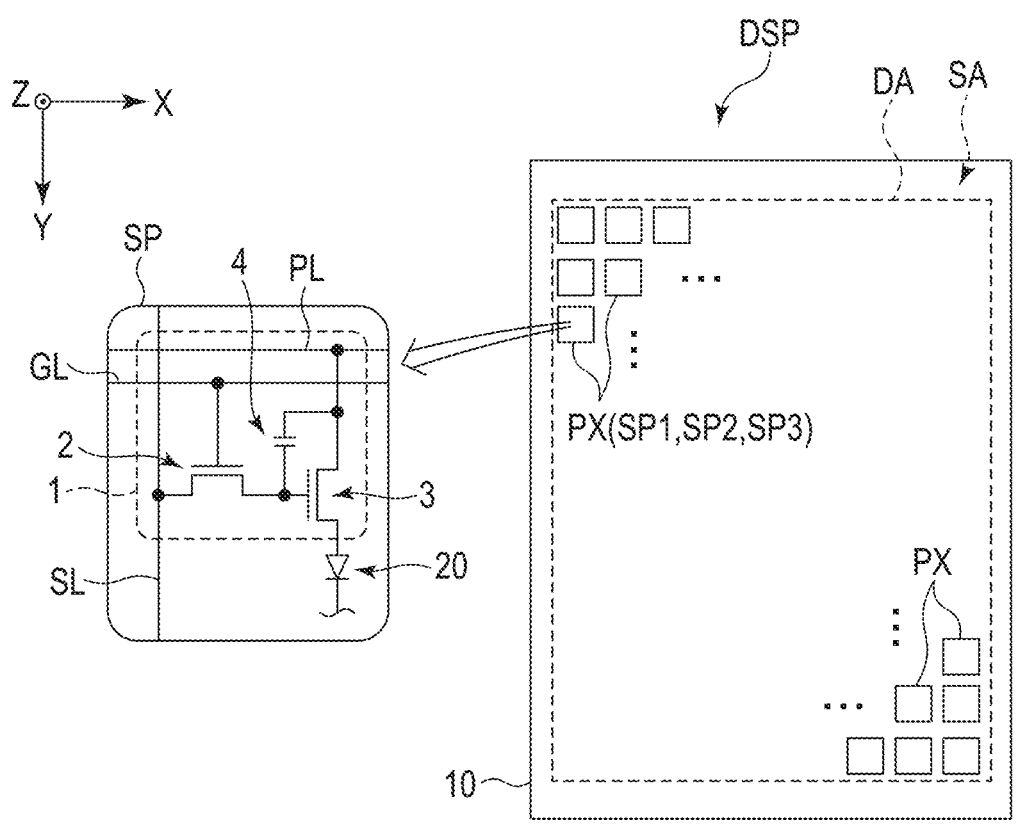
FIG. 1 is a diagram showing a configuration example of a display device DSP.

An object of an embodiment is to provide a method of manufacturing a display device which can prevent a decrease in reliability.

In general, according to one embodiment, a method of manufacturing a display device, the method comprises preparing a processing substrate by forming a first lower electrode of a first sub-pixel, a second lower electrode of a second sub-pixel, and a third lower electrode of a third sub-pixel, and by forming a rib having a first aperture overlapping the first lower electrode, a second aperture overlapping the second lower electrode, and a third aperture overlapping the third lower electrode; forming a first thin film including a first light emitting layer over the first sub-pixel, the second sub-pixel, and the third sub-pixel; forming a first resist that exposes the first thin film in the second sub-pixel and the third sub-pixel and covers the first thin film in the first sub-pixel; removing the first thin film in the second sub-pixel and the third sub-pixel using the first resist as a mask, remaining the first thin film in the first sub-pixel, exposing the second lower electrode from the second aperture, and exposing the third lower electrode from the third aperture; removing the first resist; forming a second thin film including a second light emitting layer over the first sub-pixel, the second sub-pixel, and the third sub-pixel; forming a second resist that exposes the second thin film in the first sub-pixel and the third sub-pixel and covers the second thin film in the second sub-pixel; removing the second thin film in the first sub-pixel and the third sub-pixel using the second resist as a mask, remaining the second thin film in the second sub-pixel, and exposing the third lower electrode from the third aperture; and removing the second resist, wherein an area of the first aperture is larger than an area of the second aperture.

According to another embodiment, a method of manufacturing a display device, the method comprises preparing a processing substrate by forming a first lower electrode of a first sub-pixel, a second lower electrode of a second sub-pixel, and a third lower electrode of a third sub-pixel, and by forming a rib having a first aperture overlapping the first lower electrode, a second aperture overlapping the second lower electrode, and a third aperture overlapping the third lower electrode; forming a first thin film including a first light emitting layer that emits light in a blue wavelength range over the first sub-pixel, the second sub-pixel, and the third sub-pixel; forming a first resist that exposes the first thin film in the second sub-pixel and the third sub-pixel and covers the first thin film in the first sub-pixel; removing the first thin film in the second sub-pixel and the third sub-pixel using the first resist as a mask, remaining the first thin film in the first sub-pixel, exposing the second lower electrode from the second aperture, and exposing the third lower electrode from the third aperture; removing the first resist; forming a second thin film including a second light emitting layer that emits light in a green wavelength range over the first sub-pixel, the second sub-pixel, and the third sub-pixel; forming a second resist that exposes the second thin film in the first sub-pixel and the third sub-pixel and covers the second thin film in the second sub-pixel; removing the second thin film in the first sub-pixel and the third sub-pixel using the second resist as a mask, remaining the second thin film in the second sub-pixel, and exposing the third lower electrode from the third aperture; removing the second resist; forming a third thin film including a third light emitting layer that emits light in a red wavelength range over the first sub-pixel, the second sub-pixel, and the third sub-pixel; forming a third resist that exposes the third thin film in the first sub-pixel and the second sub-pixel and covers the third thin film in the third sub-pixel; removing the third thin film in the first sub-pixel and the second sub-pixel using the third resist as a mask, and remaining the third thin film in the third sub-pixel; and removing the third resist.

According to yet another embodiment, a method of manufacturing a display device, the method comprises preparing a processing substrate by forming a first lower electrode of a first sub-pixel, a second lower electrode of a second sub-pixel, and a third lower electrode of a third sub-pixel, and by forming a rib having a first aperture overlapping the first lower electrode, a second aperture overlapping the second lower electrode, and a third aperture overlapping the third lower electrode; forming a first thin film including a first light emitting layer that emits light in a blue wavelength range over the first sub-pixel, the second sub-pixel, and the third sub-pixel; forming a first resist that exposes the first thin film in the second sub-pixel and the third sub-pixel and covers the first thin film in the first sub-pixel; removing the first thin film in the second sub-pixel and the third sub-pixel using the first resist as a mask, remaining the first thin film in the first sub-pixel, exposing the second lower electrode from the second aperture, and exposing the third lower electrode from the third aperture; removing the first resist; forming a second thin film including a second light emitting layer that emits light in a red wavelength range over the first sub-pixel, the second sub-pixel, and the third sub-pixel; forming a second resist that exposes the second thin film in the first sub-pixel and the third sub-pixel and covers the second thin film in the second sub-pixel; removing the second thin film in the first sub-pixel and the third sub-pixel using the second resist as a mask, remaining the second thin film in the second sub-pixel, and exposing the third lower electrode from the third aperture; removing the second resist; forming a third thin film including a third light emitting layer that emits light in a green wavelength range over the first sub-pixel, the second sub-pixel, and the third sub-pixel; forming a third resist that exposes the third thin film in the first sub-pixel and the second sub-pixel and covers the third thin film in the third sub-pixel; removing the third thin film in the first sub-pixel and the second sub-pixel using the third resist as a mask, and remaining the third thin film in the third sub-pixel; and removing the third resist.

According to one embodiment, it is possible to provide the method of manufacturing the display device which can prevent a decrease in reliability.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction. A direction parallel to the Y-axis is referred to as a second direction. A direction parallel to the Z-axis is referred to as a third direction. A plan view is defined as appearance when various types of elements are viewed parallel to the third direction Z.

The display device of the present embodiment is an organic electroluminescent display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP.

The display device DSP has a display area DA for displaying an image and a peripheral area SA around the display area DA on an insulating substrate 10. The substrate 10 may be glass or a flexible resin film.

In the present embodiment, the substrate 10 has a rectangular shape in plan view. However, the shape of the substrate 10 in plan view is not limited to a rectangle shape, and may be another shape such as a square shape, a circular shape, or an elliptical shape.

The display area DA includes a plurality of pixels PX arranged in a matrix in the first direction X and the second direction Y. Each of the pixels PX includes a plurality of sub-pixels SP. For example, each of the pixels PX includes a sub-pixel SP1 of a first color, a sub-pixel SP2 of a second color, and a sub-pixel SP3 of a third color. The first color, the second color, and the third color are different from each other. Incidentally, the pixel PX may include a sub-pixel SP of another color such as white together with the sub-pixels SP1, SP2, and SP3 or instead of any of the sub-pixels SP1, SP2, and SP3.

Each of the sub-pixels SP includes a pixel circuit 1 and a display element 20 that is driven by the pixel circuit 1. The pixel circuit 1 includes a pixel switch 2, a drive transistor 3, and a capacitor 4. For example, the pixel switch 2 and the drive transistor 3 are switching elements including thin-film transistors.

The gate electrode of the pixel switch 2 is connected to a scanning line GL. One of the source electrode and the drain electrode of the pixel switch 2 is connected to a signal line SL, and the other of the source electrode and the drain electrode of the pixel switch 2 is connected to the gate electrode of the drive transistor 3 and the capacitor 4. One of the source electrode and the drain electrode of the drive transistor 3 is connected to a power line PL and the capacitor 4, and the other of the source electrode and the drain electrode of the drive transistor 3 is connected to the anode of the display element 20.

Incidentally, the configuration of the pixel circuit 1 is not limited to the shown example. For example, the pixel circuit 1 may include more thin-film transistors and capacitors.

The display element 20 is an organic light-emitting diode (OLED) as a light emitting element, and may be referred to as an organic EL element.

Figure 2:
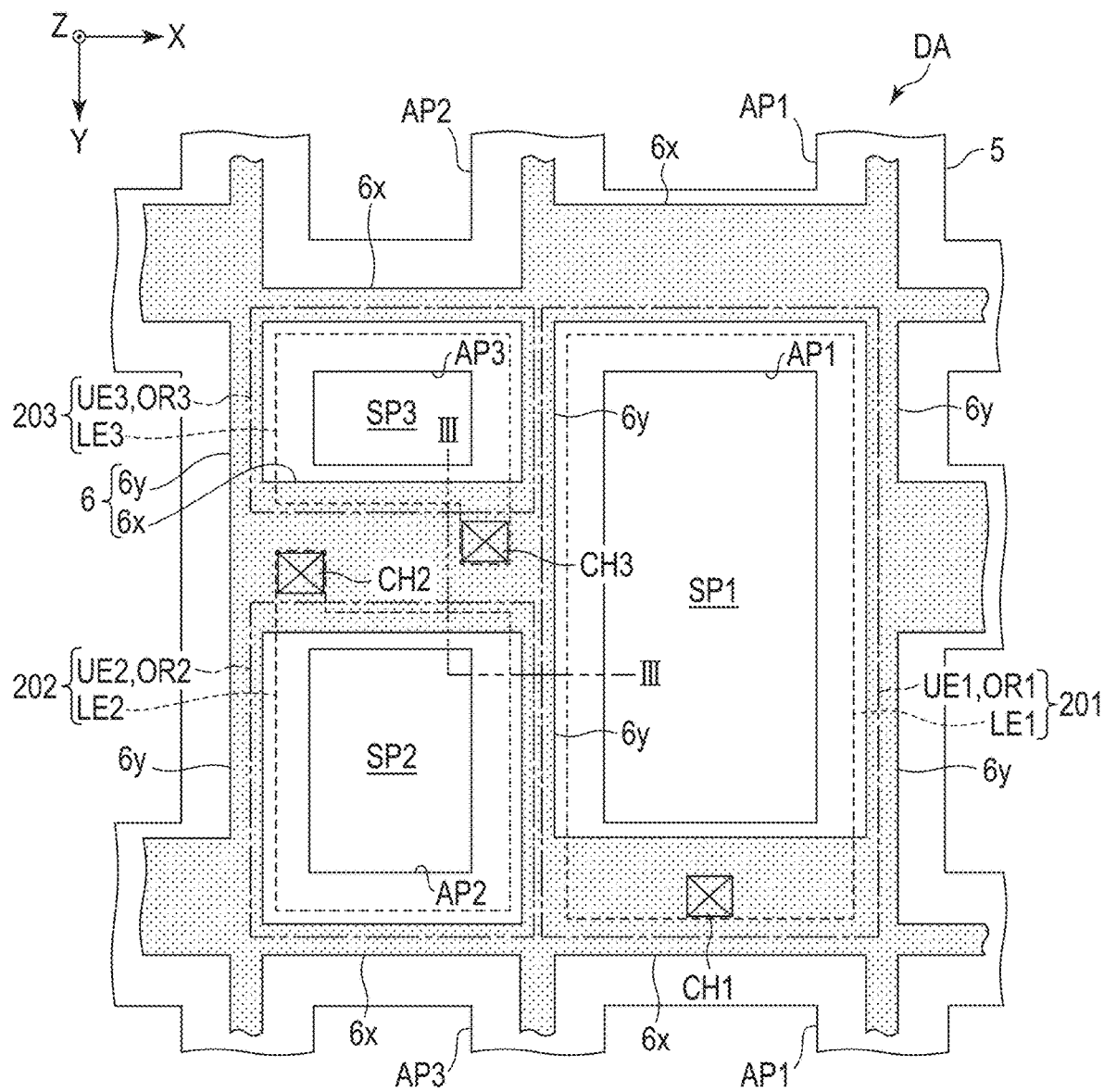
FIG. 2 is a diagram showing an example of a layout of sub-pixels SP1, SP2, and SP3.

FIG. 2 is a diagram showing an example of a layout of the sub-pixels SP1, SP2, and SP3.

In the example illustrated in FIG. 2, the sub-pixel SP2 and the sub-pixel SP3 are arranged in the second direction Y. Further, each of the sub-pixels SP2 and SP3 is adjacent to the sub-pixel SP1 in the first direction X.

In a case where the sub-pixels SP1, SP2, and SP3 have such a layout, a column in which the sub-pixels SP2 and SP3 are alternately disposed in the second direction Y and a column in which the plurality of sub-pixels SP1 are disposed in the second direction Y are formed in the display area DA. These columns are alternately arranged in the first direction X.

Incidentally, the layout of the sub-pixels SP1, SP2, and SP3 is not limited to the example illustrated in FIG. 2. For example, the sub-pixels SP1, SP2, and SP3 in each pixel PX may be arranged in order in the first direction X.

A rib 5 and a partition 6 are disposed in the display area DA. The rib 5 has apertures AP1, AP2, and AP3 in the sub-pixels SP1, SP2, and SP3, respectively.

The partition 6 overlaps the rib 5 in plan view. The partition 6 includes a plurality of first partitions 6x extending in the first direction X and a plurality of second partitions 6y extending in the second direction Y. The plurality of first partitions 6x are disposed between the apertures AP2 and AP3 adjacent to each other in the second direction Y and between the two apertures AP1 adjacent to each other in the second direction Y. The second partitions 6y are disposed between the apertures AP1 and AP2 adjacent to each other in the first direction X and between the apertures AP1 and AP3 adjacent to each other in the first direction X.

In the example illustrated in FIG. 2, the first partitions 6x and the second partitions 6y are connected to each other. Thus, the partition 6 is formed in a lattice shape surrounding the apertures AP1, AP2, and AP3 as a whole. It can also be said that the partition 6 has the apertures in the sub-pixels SP1, SP2, and SP3 similarly to the rib 5.

The sub-pixels SP1, SP2, and SP3 includes display elements 201, 202, and 203 as the display elements 20, respectively.

The sub-pixel SP1 includes a lower electrode LE1, an upper electrode UE1, and an organic layer OR1 that overlap the aperture AP1. The sub-pixel SP2 includes a lower electrode LE2, an upper electrode UE2, and an organic layer OR2 that overlap the aperture AP2. The sub-pixel SP3 includes a lower electrode LE3, an upper electrode UE3, and an organic layer OR3 that overlap the aperture AP3.

In the example illustrated in FIG. 2, the outer shapes of the lower electrodes LE1, LE2, and LE3 are indicated by dotted lines, and the outer shapes of the organic layers OR1, OR2, and OR3 and the upper electrodes UE1, UE2, and UE3 are indicated by alternate long and short dash lines. Peripheral portions of the lower electrodes LE1, LE2, and LE3 overlap the rib 5. The outer shape of the upper electrode UE1 substantially matches the outer shape of the organic layer OR1, and peripheral portions of the upper electrode UE1 and the organic layer OR1 overlap the partition 6. The outer shape of the upper electrode UE2 substantially matches the outer shape of the organic layer OR2, and peripheral portions of the upper electrode UE2 and the organic layer OR2 overlap the partition 6. The outer shape of the upper electrode UE3 substantially matches the outer shape of the organic layer OR3, and peripheral portions of the upper electrode UE3 and the organic layer OR3 overlap the partition 6.

The lower electrode LE1, the upper electrode UE1, and the organic layer OR1 constitute the display element 201 of the sub-pixel SP1. The lower electrode LE2, the upper electrode UE2, and the organic layer OR2 constitute the display element 202 of the sub-pixel SP2. The lower electrode LE3, the upper electrode UE3, and the organic layer OR3 constitute the display element 203 of the sub-pixel SP3.

The lower electrodes LE1, LE2, and LE3 correspond to, for example, the anode of the display element. The upper electrodes UE1, UE2, and UE3 correspond to the cathode of the display element or a common electrode.

The lower electrode LE1 is connected to the pixel circuit 1 (see FIG. 1) of the sub-pixel SP1 through a contact hole CH1. The lower electrode LE2 is connected to the pixel circuit 1 of the sub-pixel SP2 through a contact hole CH2. The lower electrode LE3 is connected to the pixel circuit 1 of the sub-pixel SP3 through a contact hole CH3.

In the example illustrated in FIG. 2, the area of the aperture AP1 is larger than the area of the aperture AP2, and the area of the aperture AP2 is larger than the area of the aperture AP3. In other words, the area of the lower electrode LE1 exposed from the aperture AP1 is larger than the area of the lower electrode LE2 exposed from the aperture AP2, and the area of the lower electrode LE2 exposed from the aperture AP2 is larger than the area of the lower electrode LE3 exposed from the aperture AP3.

The relationship between the areas of the apertures and the colors of the sub-pixels is as follows.

A sub-pixel having a large aperture area is allocated to a pixel having a relatively short lifetime or a pixel having low light emission efficiency. In addition, it can also be said that the sub-pixel having a large aperture area is a pixel sensitive to process variation. For this reason, it is desirable that the sub-pixel having a large aperture area is formed in a situation where a few contaminants are present. In other words, in a case where the pixel PX includes three sub-pixels having different aperture areas, it is desirable to first form a sub-pixel having the largest aperture area and finally form a sub-pixel having the smallest aperture area.

For example, the display element 201 of the sub-pixel SP1 is configured to emit light in the blue wavelength range. In addition, the display element 202 of the sub-pixel SP2 is configured to emit light in the green wavelength range, and the display element 203 of the sub-pixel SP3 is configured to emit light in the red wavelength range.

Alternatively, the display element 201 of the sub-pixel SP1 may be configured to emit light in the blue wavelength range, the display element 202 of the sub-pixel SP2 may be configured to emit light in the red wavelength range, and the display element 203 of the sub-pixel SP3 may be configured to emit light in the green wavelength range.

Figure 3:
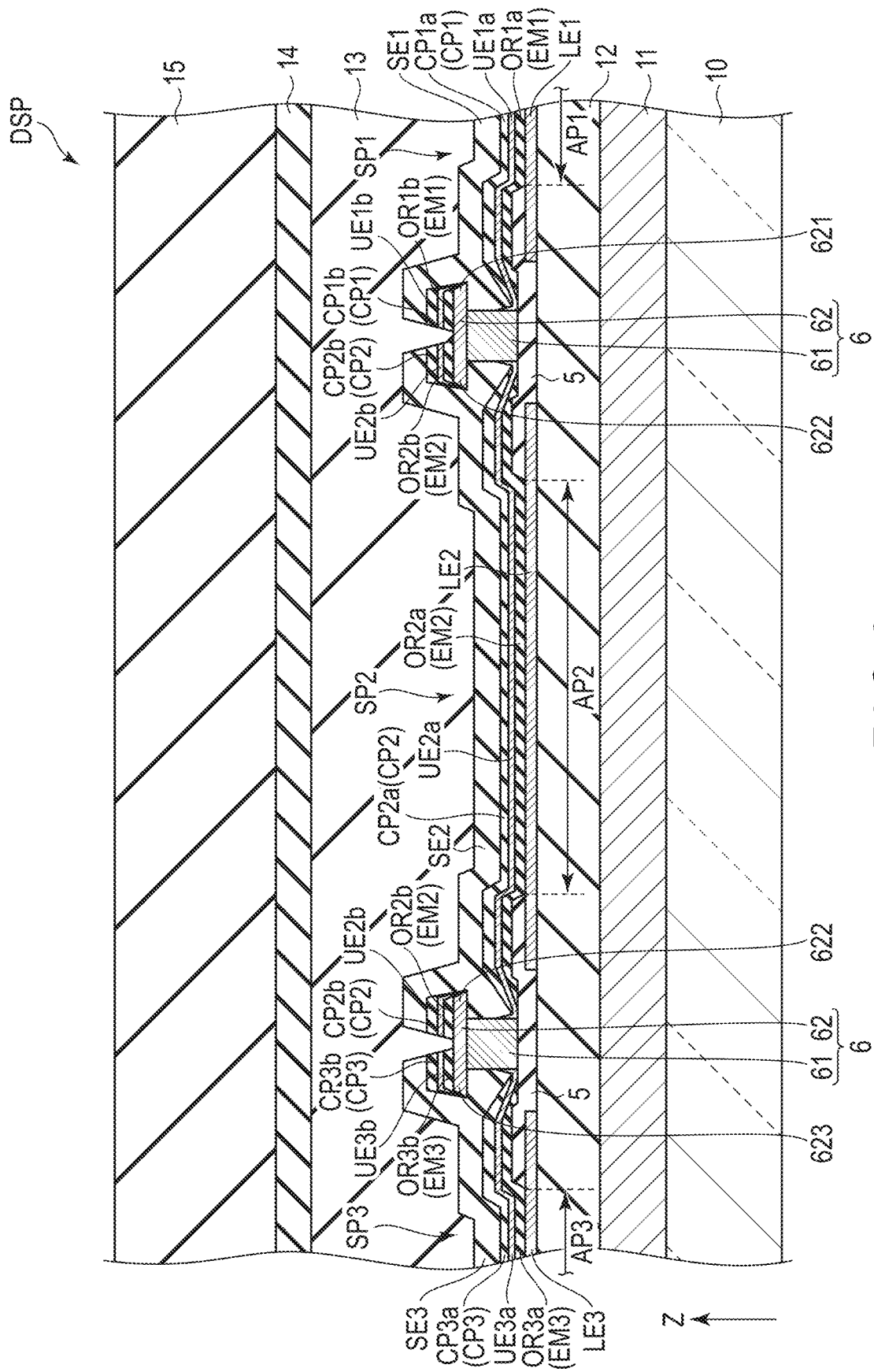
FIG. 3 is a schematic cross-sectional view of the display device DSP taken along line III-III in FIG. 2.

FIG. 3 is a schematic cross-sectional view of the display device DSP taken along line III-III in FIG. 2.

A circuit layer 11 is disposed on the substrate 10 described above. The circuit layer 11 includes various circuits such as the pixel circuit 1, and various lines such as the scanning line GL, the signal line SL, and the power line PL, shown in FIG. 1. The circuit layer 11 is covered with an insulating layer 12. The insulating layer 12 functions as a planarizing film that planarizes uneven parts caused by the circuit layer 11.

The lower electrodes LE1, LE2, and LE3 are disposed on the insulating layer 12. The rib 5 is disposed on the insulating layer 12 and the lower electrodes LE1, LE2, and LE3. End portions of the lower electrodes LE1, LE2, and LE3 are covered with the rib 5. In other words, the end portions of the lower electrodes LE1, LE2, and LE3 are disposed between the insulating layer 12 and the rib 5. The insulating layer 12 is covered with the rib 5 between the lower electrodes adjacent to each other among the lower electrodes LE1, LE2, and LE3.

The partition 6 includes a lower portion (stem) 61 disposed on the rib 5 and an upper portion (shade) 62 disposed on the lower portion 61. The lower portion 61 of the partition 6 shown on the right side of the drawing is located between the aperture AP1 and the aperture AP2. The lower portion 61 of the partition 6 shown on the left side of the drawing is located between the aperture AP2 and the aperture AP3. The upper portion 62 has a larger width than that of the lower portion 61. As a result, in FIG. 3, both end portions of the upper portion 62 protrude from the side surfaces of the lower portion 61. Such a shape of the partition 6 can also be referred to as an overhang shape. In the upper portion 62, a part protruding from the lower portion 61 may be simply referred to as a protruding portion.

As shown in FIG. 3, the organic layer OR1 shown in FIG. 2 includes a first part OR1a and a second part OR1b spaced apart from each other. The first part OR1a is in contact with the lower electrode LE1 through the aperture AP1, covers the lower electrode LE1, and overlaps a portion of the rib 5. The second part OR1b is disposed on the upper portion 62.

In addition, as shown in FIG. 3, the upper electrode UE1 shown in FIG. 2 includes a first part UE1a and a second part UE1b spaced apart from each other. The first part UE1a faces the lower electrode LE1 and is disposed on first part OR1a. Further, the first part UE1a is in contact with the side surface of the lower portion 61. The second part UE1b is located above the partition 6 and is disposed on the second part OR1b.

The first part OR1a and the first part UE1a are located below the upper portion 62.

As shown in FIG. 3, the organic layer OR2 shown in FIG. 2 includes a first part OR2a and a second part OR2b spaced apart from each other. The first part OR2a is in contact with the lower electrode LE2 through the aperture AP2, covers the lower electrode LE2, and overlaps a portion of the rib 5. The second part OR2b is disposed on the upper portion 62.

In addition, as shown in FIG. 3, the upper electrode UE2 shown in FIG. 2 includes a first part UE2a and a second part UE2b spaced apart from each other. The first part UE2a faces the lower electrode LE2 and is disposed on first part OR2a. Further, the first part UE2a is in contact with the side surface of the lower portion 61. The second part UE2b is located above the partition 6 and is disposed on the second part OR2b.

The first part OR2a and the first part UE2a are located below the upper portion 62.

As shown in FIG. 3, the organic layer OR3 shown in FIG. 2 includes a first part OR3a and a second part OR3b spaced apart from each other. The first part OR3a is in contact with the lower electrode LE3 through the aperture AP3, covers the lower electrode LE3, and overlaps a portion of the rib 5. The second part OR3b is disposed on the upper portion 62.

In addition, as shown in FIG. 3, the upper electrode UE3 shown in FIG. 2 includes a first part UE3a and a second part UE3b spaced apart from each other. The first part UE3a faces the lower electrode LE3 and is disposed on first part OR3a. Further, the first part UE3a is in contact with the side surface of the lower portion 61. The second part UE3b is located above the partition 6 and is disposed on the second part OR3b.

The first part OR3a and the first part UE3a are located below the upper portion 62.

In the example illustrated in FIG. 3, the sub-pixels SP1, SP2, and SP3 include cap layers (optical adjustment layers) CP1, CP2, and CP3 for adjusting optical properties of light emitted by light emitting layers of the organic layers OR1, OR2, and OR3, respectively.

The cap layer CP1 includes a first part CP1a and a second part CP1b spaced apart from each other. The first part CP1a is located in the aperture AP1, is located below the upper portion 62, and is disposed on the first part UE1a. The second part CP1b is located above the partition 6 and is disposed on the second part UE1b.

The cap layer CP2 includes a first part CP2a and a second part CP2b spaced apart from each other. The first part CP2a is located in the aperture AP2, is located below the upper portion 62, and is disposed on the first part UE2a. The second part CP2b is located above the partition 6 and is disposed on the second part UE2b.

The cap layer CP3 includes a first part CP3a and a second part CP3b spaced apart from each other. The first part CP3a is located in the aperture AP3, is located below the upper portion 62, and is disposed on the first part UE3a. The second part CP3b is located above the partition 6 and is disposed on the second part UE3b.

Sealing layers SE1, SE2, and SE3 are disposed in the sub-pixels SP1, SP2, and SP3, respectively.

The sealing layer SE1 is in contact with the first part CP1a, the lower portion 61 and the upper portion 62 of the partition 6, and the second part CP1b, and continuously covers each member of the sub-pixel SP1. Incidentally, the sealing layer SE1 may have a void below the upper portion 62 of the partition 6 (below a protruding portion 621), but is not shown here.

The sealing layer SE2 is in contact with the first part CP2a, the lower portion 61 and the upper portion 62 of the partition 6, and the second part CP2b, and continuously covers each member of the sub-pixel SP2. Incidentally, the sealing layer SE2 may have a void below the upper portion 62 of the partition 6 (below a protruding portion 622), but is not shown here.

The sealing layer SE3 is in contact with the first part CP3a, the lower portion 61 and the upper portion 62 of the partition 6, and the second part CP3b, and continuously covers each member of the sub-pixel SP3. Incidentally, the sealing layer SE3 may have a void below the upper portion 62 of the partition 6 (below a protruding portion 623), but is not shown here.

The sealing layers SE1, SE2, and SE3 are covered with a protective layer 13.

In the example illustrated in FIG. 3, on the partition 6 between the sub-pixels SP1 and SP2, the second part OR1b of the organic layer OR1 is spaced apart from the second part OR2b of the organic layer OR2, the second part UE1b of the upper electrode UE1 is spaced apart from the second part UE2b of the upper electrode UE2, the second part CP1b of the cap layer CP1 is spaced apart from the second part CP2b of the cap layer CP2, and the sealing layer SE1 is spaced apart from the sealing layer SE2. The protective layer 13 is disposed between the second part OR1b and the second part OR2b, between the second part UE1b and the second part UE2b, between the second part CP1b and the second part CP2b, and between the sealing layer SE1 and the sealing layer SE2.

In addition, on the partition 6 between the sub-pixels SP2 and SP3, the second part OR2b of the organic layer OR2 is spaced apart from the second part OR3b of the organic layer OR3, the second part UE2b of the upper electrode UE2 is spaced apart from the second part UE3b of the upper electrode UE3, the second part CP2b of the cap layer CP2 is spaced apart from the second part CP3b of the cap layer CP3, and the sealing layer SE2 is spaced apart from the sealing layer SE3. The protective layer 13 is disposed between the second part OR2b and the second part OR3b, between the second part UE2b and the second part UE3b, between the second part CP2b and the second part CP3b, and between the sealing layer SE2 and the sealing layer SE3.

The insulating layer 12 is an organic insulating layer. The rib 5 and the sealing layers SE1, SE2, and SE3 are inorganic insulating layers.

The sealing layers SE1, SE2, and SE3 are formed of, for example, the same inorganic insulating material.

The rib 5 is made of silicon nitride (SiNx) which is an example of an inorganic insulating material. Incidentally, the rib 5 may be formed as a single-layer body of any of silicon oxide (SiOx), silicon oxynitride (SiON), and aluminum oxide ($Al_2O_3$) as another inorganic insulating material. In addition, the rib 5 may be formed as a stacked layer body of a combination of at least two of a silicon nitride layer, a silicon oxide layer, a silicon oxynitride layer, and an aluminum oxide layer.

The sealing layers SE1, SE2, and SE3 are formed of silicon nitride (SiNx) which is an example of an inorganic insulating material. Incidentally, the sealing layers SE1, SE2, and SE3 may be formed as a single-layer body of any of silicon oxide (SiOx), silicon oxynitride (SiON), and aluminum oxide ($Al_2O_3$) as another inorganic insulating material. In addition, the sealing layers SE1, SE2, and SE3 may be formed as a stacked layer body of a combination of at least two of a silicon nitride layer, a silicon oxide layer, a silicon oxynitride layer, and an aluminum oxide layer. For this reason, the sealing layers SE1, SE2, and SE3 may be formed of the same material as that of the rib 5.

The lower portion 61 of the partition 6 is formed of a conductive material, and is electrically connected to the first parts UE1a, UE2a, and UE3a of the upper electrodes. Both the lower portion 61 and the upper portion 62 of the partition 6 may have conductivity.

The thickness of the rib 5 is sufficiently smaller than the thickness of the partition 6 and the thickness of the insulating layer 12. For example, the thickness of the rib 5 is 200 nm or more and 400 nm or less.

The thickness of the sealing layer SE1, the thickness of the sealing layer SE2, and the thickness of the sealing layer SE3 are substantially equal.

The thickness of the lower portion 61 of the partition 6 (the thickness from the upper surface of the rib 5 to the lower surface of the upper portion 62) is larger than the thickness of the rib 5.

The lower electrodes LE1, LE2, and LE3 may be formed of a transparent conductive material such as ITO, or may have a stacked structure of a metal material such as silver (Ag) and a transparent conductive material. The upper electrodes UE1, UE2, and UE3 are formed of, for example, a metal material such as an alloy of magnesium and silver (MgAg). The upper electrodes UE1, UE2, and UE3 may be formed of a transparent conductive material such as ITO.

When the electric potentials of the lower electrodes LE1, LE2, and LE3 are relatively higher than the electric potentials of the upper electrodes UE1, UE2, and UE3, the lower electrodes LE1, LE2, and LE3 correspond to the anode, and the upper electrodes UE1, UE2, and UE3 correspond to the cathode. In addition, when the electric potentials of the upper electrodes UE1, UE2, and UE3 are relatively higher than the electric potentials of the lower electrodes LE1, LE2, and LE3, the upper electrodes UE1, UE2, and UE3 correspond to the anode, and the lower electrodes LE1, LE2, and LE3 correspond to the cathode.

The organic layers OR1, OR2, and OR3 include a plurality of functional layers. In addition, the first part OR1a and the second part OR1b of the organic layer OR1 include a light emitting layer EM1 formed of the same material. The first part OR2a and the second part OR2b of the organic layer OR2 include a light emitting layer EM2 formed of the same material. The light emitting layer EM2 is formed of a material different from that of the light emitting layer EM1. The first part OR3a and the second part OR3b of the organic layer OR3 include a light emitting layer EM3 formed of the same material. The light emitting layer EM3 is formed of a material different from those of the light emitting layers EM1 and EM2.

The material forming the light emitting layer EM1, the material forming the light emitting layer EM2, and the material forming the light emitting layer EM3 are materials that emit light in different wavelength ranges.

For example, the light emitting layer EM1 is formed of a material that emits light in the blue wavelength range, the light emitting layer EM2 is formed of a material that emits light in the green wavelength range, and the light emitting layer EM3 is formed of a material that emits light in the red wavelength range. Alternatively, the light emitting layer EM1 is formed of a material that emits light in the blue wavelength range, the light emitting layer EM2 is formed of a material that emits light in the red wavelength range, and the light emitting layer EM3 is formed of a material that emits light in the green wavelength range.

The cap layers CP1, CP2, and CP3 are formed of, for example, a multilayer body of transparent thin films. The multilayer body may include a thin film formed of an inorganic material and a thin film formed of an organic material as the thin films. The plurality of thin films has different refractive indexes. The materials of the thin films constituting the multilayer body are different from the materials of the upper electrodes UE1, UE2, and UE3, and are also different from the materials of the sealing layers SE1, SE2, and SE3. Incidentally, the cap layers CP1, CP2, and CP3 may be omitted.

The protective layer 13 is a transparent organic insulating layer. The sealing layer 14 is a transparent inorganic insulating layer and is disposed on the protective layer 13. The sealing layer 14 is formed of, for example, silicon nitride (SiNx). An overcoat layer 15 is a transparent organic insulating layer and is disposed on the sealing layer 14.

A common voltage is supplied to the partition 6. This common voltage is supplied to each of the first parts UE1a, UE2a, and UE3a of the upper electrodes that are in contact with the side surfaces of the lower portion 61. Pixel voltages are supplied to the lower electrodes LE1, LE2, and LE3 through the pixel circuits 1 of the sub-pixels SP1, SP2, and SP3.

When an electric potential difference is formed between the lower electrode LE1 and the upper electrode UE1, the light emitting layer EM1 of the first part OR1a of the organic layer OR1 emits light in the first wavelength range. When an electric potential difference is formed between the lower electrode LE2 and the upper electrode UE2, the light emitting layer EM2 of the first part OR2a of the organic layer OR2 emits light in the second wavelength range. When an electric potential difference is formed between the lower electrode LE3 and the upper electrode UE3, the light emitting layer EM3 of the first part OR3a of the organic layer OR3 emits light in the third wavelength range.

Figure 4:
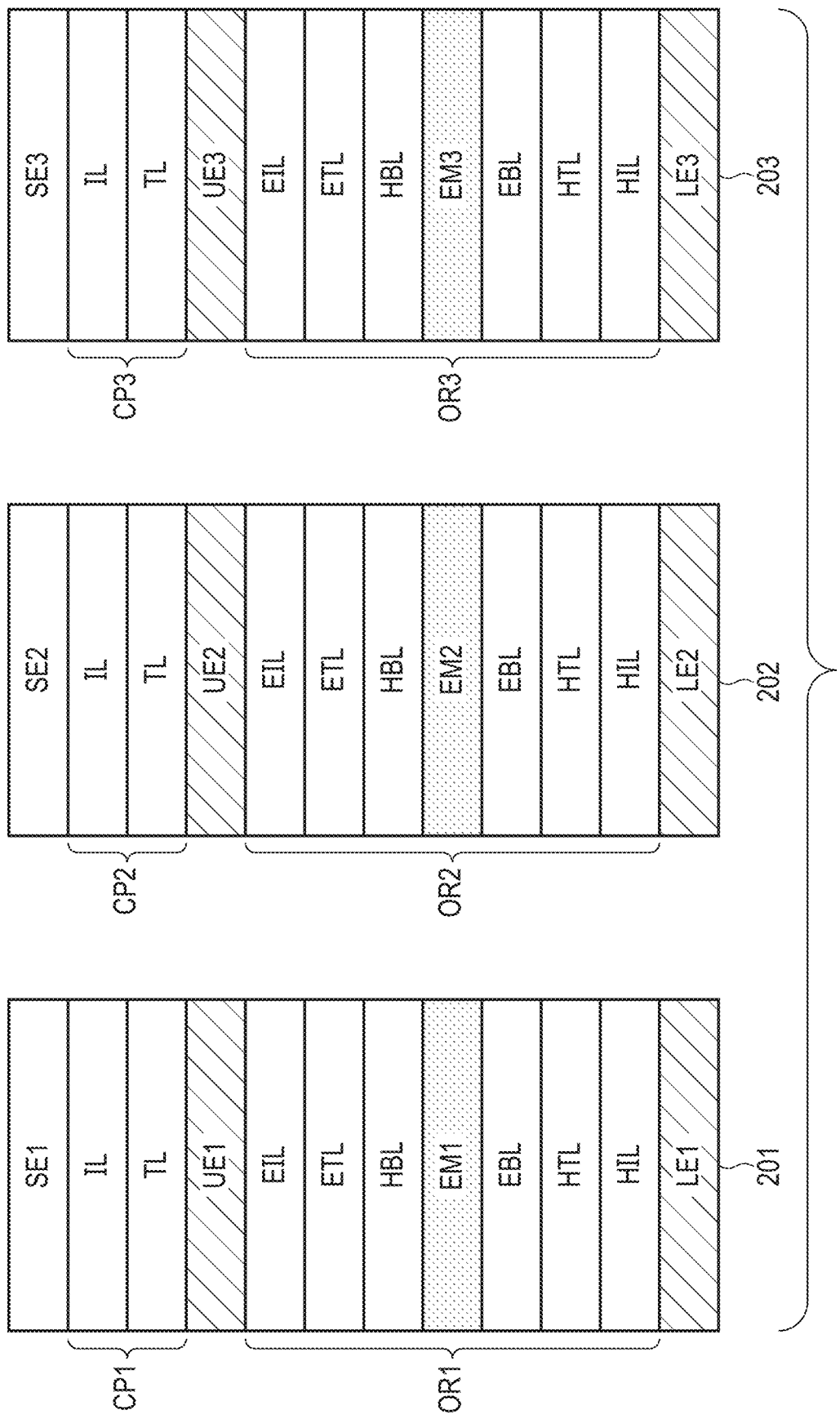
FIG. 4 is a diagram showing an example of a configuration of display elements 201 to 203.

FIG. 4 is a diagram showing an example of a configuration of display elements 201 to 203. Incidentally, an example in which the lower electrodes correspond to the anode and the upper electrodes correspond to the cathode will be described.

The display element 201 includes the organic layer OR1 between the lower electrode LE1 and the upper electrode UE1.

In the organic layer OR1, a hole-injection layer HIL, a hole-transport layer HTL, and an electron blocking layer EBL are located between the lower electrode LE1 and the light emitting layer EM1. The hole-injection layer HIL is disposed on the lower electrode LE1, the hole-transport layer HTL is disposed on the hole-injection layer HIL, the electron blocking layer EBL is disposed on the hole-transport layer HTL, and the light emitting layer EM1 is disposed on the electron blocking layer EBL.

In addition, in the organic layer OR1, a hole blocking layer HBL, an electron-transport layer ETL, and an electron-injection layer EIL are located between the light emitting layer EM1 and the upper electrode UE1. The hole blocking layer HBL is disposed on the light emitting layer EM1, the electron-transport layer ETL is disposed on the hole blocking layer HBL, the electron-injection layer EIL is disposed on the electron-transport layer ETL, and the upper electrode UE1 is disposed on the electron-injection layer EIL.

Incidentally, the organic layer OR1 may include other functional layers such as a carrier generation layer as needed in addition to the functional layers described above, or at least one of the functional layers described above may be omitted.

The cap layer CP1 includes a transparent layer TL and an inorganic layer IL. The transparent layer TL is disposed on the upper electrode UE1. The inorganic layer IL is disposed on the transparent layer TL. The sealing layer SE1 is disposed on the inorganic layer IL.

The transparent layer TL is, for example, an organic layer formed of, for example, an organic material, and is a high refractive index layer having a refractive index higher than that of the upper electrode UE1. The inorganic layer IL is, for example, a transparent thin film formed of lithium fluoride (LiF), and is a low refractive index layer having a refractive index lower than that of the transparent layer TL.

Incidentally, in the example illustrated in FIG. 4, the cap layer CP1 is a stacked layer body of two layers of the transparent layer TL and the inorganic layer IL, but may be a stacked layer body of three or more layers. In the cap layer CP1, the inorganic layer IL is located in the uppermost layer and covered with the sealing layer SE1.

The display element 202 is configured similarly to the display element 201 except that the organic layer OR2 between the lower electrode LE2 and the upper electrode UE2 includes the light emitting layer EM2 instead of the light emitting layer EM1.

The transparent layer TL of the cap layer CP2 is disposed on the upper electrode UE2, and the inorganic layer IL of the cap layer CP2 is covered with the sealing layer SE2.

The display element 203 is configured similarly to the display element 201 except that the organic layer OR3 between the lower electrode LE3 and the upper electrode UE3 includes the light emitting layer EM3 instead of the light emitting layer EM1.

The transparent layer TL of the cap layer CP3 is disposed on the upper electrode UE3, and the inorganic layer IL of the cap layer CP3 is covered with the sealing layer SE3.

Each of the functional layers such as the hole-injection layer HIL, the hole-transport layer HTL, the electron blocking layer EBL, the hole blocking layer HBL, the electron-transport layer ETL, and the electron-injection layer EIL shown in FIG. 4 is provided in common in the display elements 201 to 203, but is divided for each of the display elements 201 to 203 and are individually formed for each of the display elements 201 to 203. The thickness of each of the functional layers described above may be different for each of the display elements 201 to 203.

In addition, taking note of one functional layer among the above-described plurality of functional layers, the functional layer in one display element among the display elements 201 to 203 may be formed of a material different from that of the functional layer in the other two display elements. All the functional layers of the display elements 201 to 203 may be formed of materials different from each other.

In addition, the layer configuration of one display element among the display elements 201 to 203 may be different from the layer configurations of the other two display elements, or all the layer configurations of the display elements 201 to 203 may be different from each other. For example, taking note of one functional layer, one of the display elements 201 to 203 may not include this functional layer, or only one of the display elements 201 to 203 may include this functional layer. In addition, taking note of one functional layer, there may be a case where this functional layer is multilayered in one display element among the display elements 201 to 203.

Each of the transparent layer TL and the inorganic layer IL is provided in common in the display elements 201 to 203, but is divided for each of the display elements 201 to 203 and is individually formed for each of the display elements 201 to 203. The thickness of each of the transparent layer TL and the inorganic layer IL may be different for each of the cap layers CP1 to CP3.

In addition, the transparent layer TL of one cap layer among the cap layers CP1 to CP3 may be formed of a material different from the materials of the transparent layers TL of the other two cap layers, or all the transparent layers TL of the cap layers CP1 to CP3 may be formed of materials different from each other.

In addition, the inorganic layer IL of one cap layer among the cap layers CP1 to CP3 may be formed of a material different from the materials of the inorganic layers IL of the other two cap layers, or all the inorganic layers IL of the cap layers CP1 to CP3 may be formed of materials different from each other.

In addition, the layer configuration of one cap layer among the cap layers CP1 to CP3 may be different from the layer configurations of the other two cap layers, or all the layer configurations of the cap layers CP1 to CP3 may be different from each other.

Next, an example of a method of manufacturing the display device DSP will be described.

Figure 5:
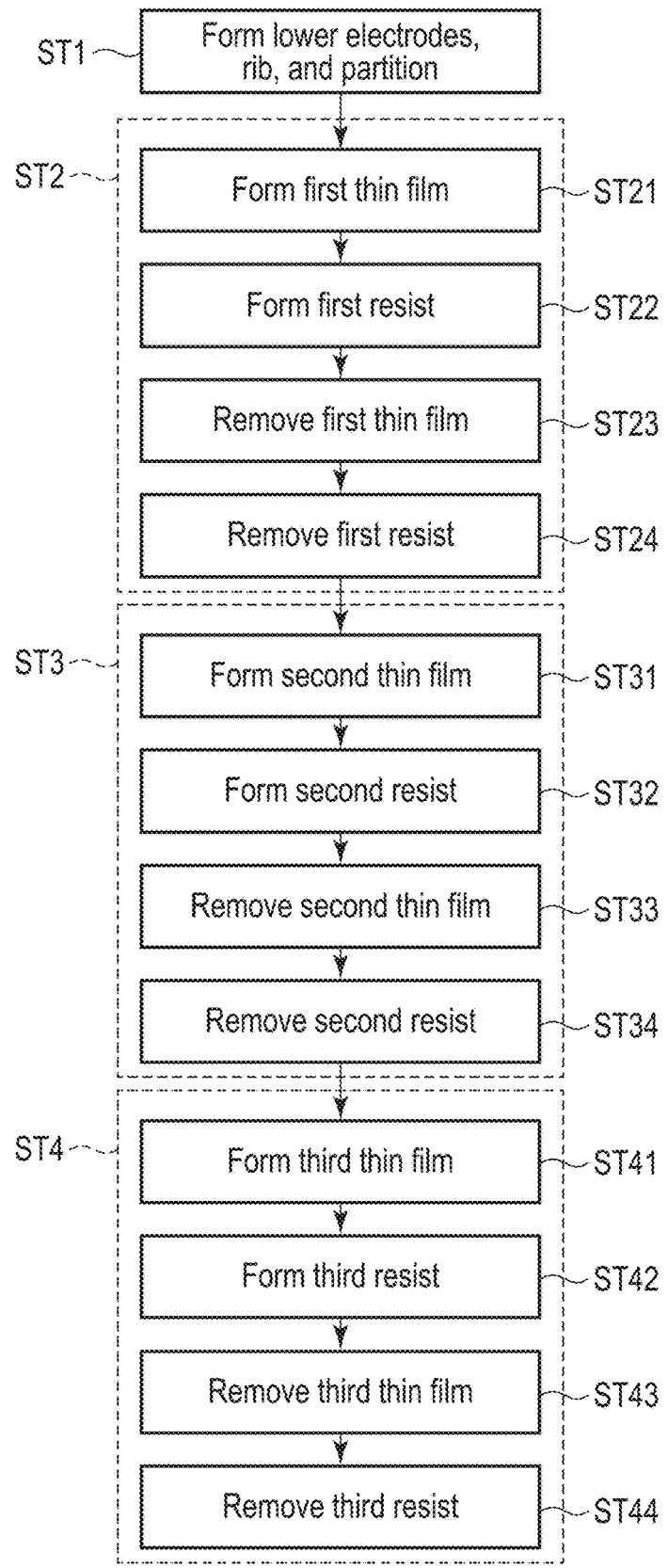
FIG. 5 is a flowchart for explaining an example of a method of manufacturing the display device DSP.

FIG. 5 is a flowchart for explaining an example of a method of manufacturing the display device DSP;

The manufacturing method described herein roughly includes a process of preparing a processing substrate SUB including the sub-pixel SP1, the sub-pixel SP2, and the sub-pixel SP3 (step ST1), a process of forming the display element 201 of the sub-pixel SP1 (step ST2), a process of forming the display element 202 of the sub-pixel SP2 (step ST3), and a process of forming the display element 203 of the sub-pixel SP3 (step ST4).

In step ST1, first, the processing substrate SUB in which the lower electrode LE1 of the sub-pixel SP1, the lower electrode LE2 of the sub-pixel SP2, the lower electrode LE3 of the sub-pixel SP3, the rib 5, and the partition 6 are formed on the substrate 10 is prepared. As shown in FIG. 3, the circuit layer 11 and the insulating layer 12 are also formed between the substrate 10 and the lower electrodes LE1, LE2, and LE3. Details will be described later.

In step ST2, first, a first thin film 31 including the light emitting layer EM1 is formed on the processing substrate SUB (step ST21). Thereafter, a first resist 41 patterned in a predetermined shape is formed on the first thin film 31 (step ST22). Thereafter, a portion of the first thin film 31 is removed by etching using the first resist 41 as a mask (step ST23). Thereafter, the first resist 41 is removed (step ST24). Thus, the sub-pixel SP1 is formed. The sub-pixel SP1 includes the display element 201 having the first thin film 31 having a predetermined shape.

In step ST3, first, a second thin film 32 including the light emitting layer EM2 is formed on the processing substrate SUB (step ST31). Thereafter, a second resist 42 patterned in a predetermined shape is formed on the second thin film 32 (step ST32). Thereafter, a portion of the second thin film 32 is removed by etching using the second resist 42 as a mask (step ST33). Thereafter, the second resist 42 is removed (step ST34). Thus, the sub-pixel SP2 is formed. The sub-pixel SP2 includes the display element 202 having the second thin film 32 having a predetermined shape.

In step ST4, first, a third thin film 33 including the light emitting layer EM3 is formed on the processing substrate SUB (step ST41). Thereafter, a third resist 43 patterned in a predetermined shape is formed on the third thin film 33 (step ST42). Thereafter, a portion of the third thin film 33 is removed by etching using the third resist 43 as a mask (step ST43). Thereafter, the third resist 43 is removed (step ST44). Thus, the sub-pixel SP3 is formed. The sub-pixel SP3 includes the display element 203 having the third thin film 33 having a predetermined shape.

Figure 6:
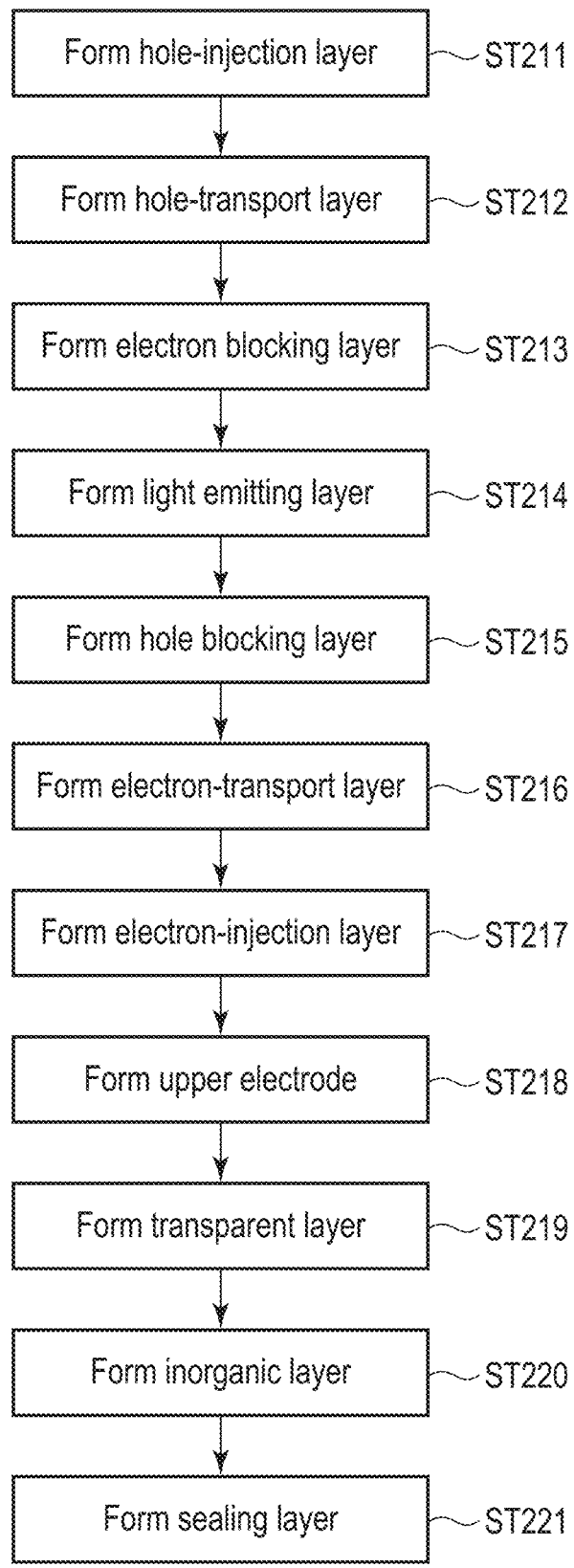
FIG. 6 is a flowchart for explaining an example of a thin film forming process.

FIG. 6 is a flowchart for explaining an example of a thin film forming process. The thin film forming process described herein corresponds to the process of forming the first thin film 31 (step ST21), the process of forming the second thin film 32 (step ST31), and the process of forming the third thin film 33 (step ST41). The process of forming the first thin film 31 will be described below. Incidentally, the first thin film 31 includes, for example, the organic layer OR1, the upper electrode UE1, the cap layer CP1, and the sealing layer SE1 shown in FIG. 4.

First, a material for forming the hole-injection layer HIL is deposited on the processing substrate SUB (step ST211). As a result, the hole-injection layer HIL in contact with the lower electrode LE1 is formed.

Thereafter, a material for forming the hole-transport layer HTL is deposited on the hole-injection layer HIL (step ST212). As a result, the hole-transport layer HTL in contact with the hole-injection layer HIL is formed.

Thereafter, a material for forming the electron blocking layer EBL is deposited on the hole-transport layer HTL (step ST213). As a result, the electron blocking layer EBL in contact with the hole-transport layer HTL is formed.

Thereafter, a material for forming the light emitting layer EM1 is deposited on the electron blocking layer EBL (step ST214). As a result, the light emitting layer EM1 in contact with the electron blocking layer EBL is formed.

Thereafter, a material for forming the hole blocking layer HBL is deposited on the light emitting layer EM1 (step ST215). As a result, the hole blocking layer HBL in contact with the light emitting layer EM1 is formed.

Thereafter, a material for forming the electron-transport layer ETL is deposited on the hole blocking layer HBL (step ST216). As a result, the electron-transport layer ETL in contact with the hole blocking layer HBL is formed.

Thereafter, a material for forming the electron-injection layer EIL is deposited on the electron-transport layer ETL (step ST217). As a result, the electron-injection layer EIL in contact with the electron-transport layer ETL is formed.

The organic layer OR1 is formed by the series of steps ST211 to ST217. Incidentally, at least one of steps ST211 to ST213 and at least one of steps ST215 to ST217 described above may be omitted as needed. In addition, in addition to the above steps ST211 to ST217, a step for forming a functional layer may be added.

Thereafter, a material for forming the upper electrode UE1 is deposited on the electron-injection layer EIL (step ST218). As a result, the upper electrode UE1 in contact with the electron-injection layer EIL and in contact with the partition 6 is formed.

Thereafter, a material for forming the transparent layer TL of the cap layer CP1 is deposited on the upper electrode UE1 (step ST219). As a result, the transparent layer TL in contact with the upper electrode UE1 is formed.

Thereafter, a material for forming the inorganic layer IL of the cap layer CP1 is deposited on the transparent layer TL (step ST220). As a result, the inorganic layer IL in contact with the transparent layer TL is formed.

In steps ST221 to ST220 described above, the method of depositing the materials is, for example, an evaporation method, but other methods may be applied. For example, the method of depositing the material in step ST218 may be a sputtering method.

Thereafter, a material for forming the sealing layer SE1 is deposited on the inorganic layer IL through a chemical-vapor deposition (CVD) process (step ST221). Thus, the sealing layer SE1 is formed so as to cover the upper electrode UE1, the cap layer CP1, and the partition 6.

The second thin film 32 includes, for example, the organic layer OR2, the upper electrode UE2, the cap layer CP2, and the sealing layer SE2 shown in FIG. 4.

In this case, the process of forming the second thin film 32 is the same as the process of forming the first thin film 31 except that the light emitting layer EM2 is formed instead of forming the light emitting layer EM1 in step ST214 described above, and the description thereof will be omitted.

The third thin film 33 includes, for example, the organic layer OR3, the upper electrode UE3, the cap layer CP3, and the sealing layer SE3 shown in FIG. 4.

In this case, the process of forming the third thin film 33 is the same as the process of forming the first thin film 31 except that the light emitting layer EM3 is formed instead of forming the light emitting layer EM1 in step ST214 described above, and the description thereof will be omitted.

Figure 7:
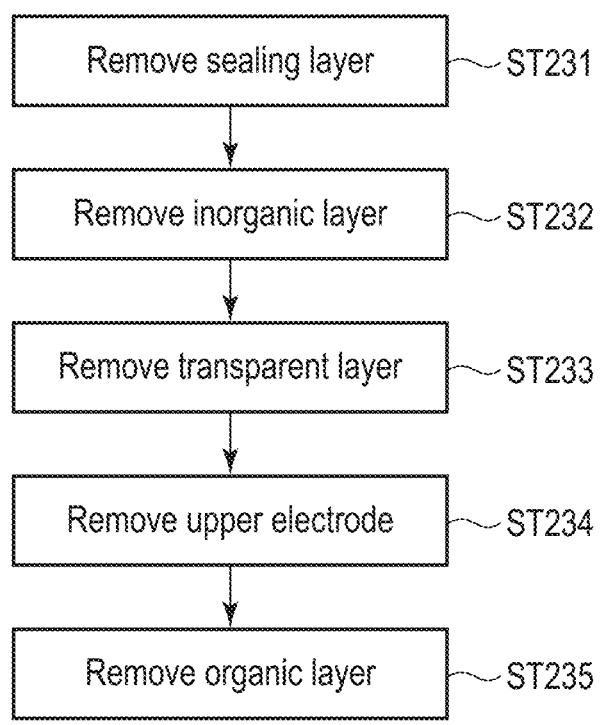
FIG. 7 is a flowchart for explaining an example of a thin film removing process.

FIG. 7 is a flowchart for explaining an example of a thin film removing process. The thin film removing process described herein corresponds to the process of removing the first thin film 31 (step ST23), the process of removing the second thin film 32 (step ST33), and the process of removing the third thin film 33 (step ST43). The process of removing the first thin film 31 will be described below.

First, dry etching is performed using the first resist 41 formed in step ST22 as a mask to remove the sealing layer SE1 exposed from the first resist 41 (step ST231).

Thereafter, wet etching is performed using the first resist 41 as a mask to remove the inorganic layer IL exposed from the sealing layer SE1 (step ST232).

Thereafter, dry etching is performed using the first resist 41 as a mask to remove the transparent layer TL exposed from the inorganic layer IL (step ST233).

Thereafter, wet etching is performed using the first resist 41 as a mask to remove the upper electrode UE1 exposed from the transparent layer TL (step ST234).

Thereafter, dry etching is performed using the first resist 41 as a mask to remove the organic layer OR1 exposed from the upper electrode UE1 (step ST235).

The process of removing the second thin film 32 is substantially the same as steps ST231 to ST235 described above, and will be briefly described below.

First, the sealing layer SE2 exposed from the second resist 42 is removed using the second resist 42 formed in step ST32 as a mask.

Thereafter, the inorganic layer IL exposed from the sealing layer SE2 is removed, the transparent layer TL exposed from the inorganic layer IL is removed, and the upper electrode UE2 exposed from the transparent layer TL is removed.

Thereafter, the organic layer OR2 exposed from the upper electrode UE2 is removed.

The process of removing the third thin film 33 is substantially the same as steps ST231 to ST235 described above, and will be briefly described below.

First, the sealing layer SE3 exposed from the third resist 43 is removed using the third resist 43 formed in step ST42 as a mask.

Thereafter, the inorganic layer IL exposed from the sealing layer SE3 is removed, the transparent layer TL exposed from the inorganic layer IL is removed, and the upper electrode UE3 exposed from the transparent layer TL is removed.

Thereafter, the organic layer OR3 exposed from the upper electrode UE3 is removed.

Hereinafter, steps ST1 and ST4 will be described with reference to FIGS. 8 to 15.

Figure 8:
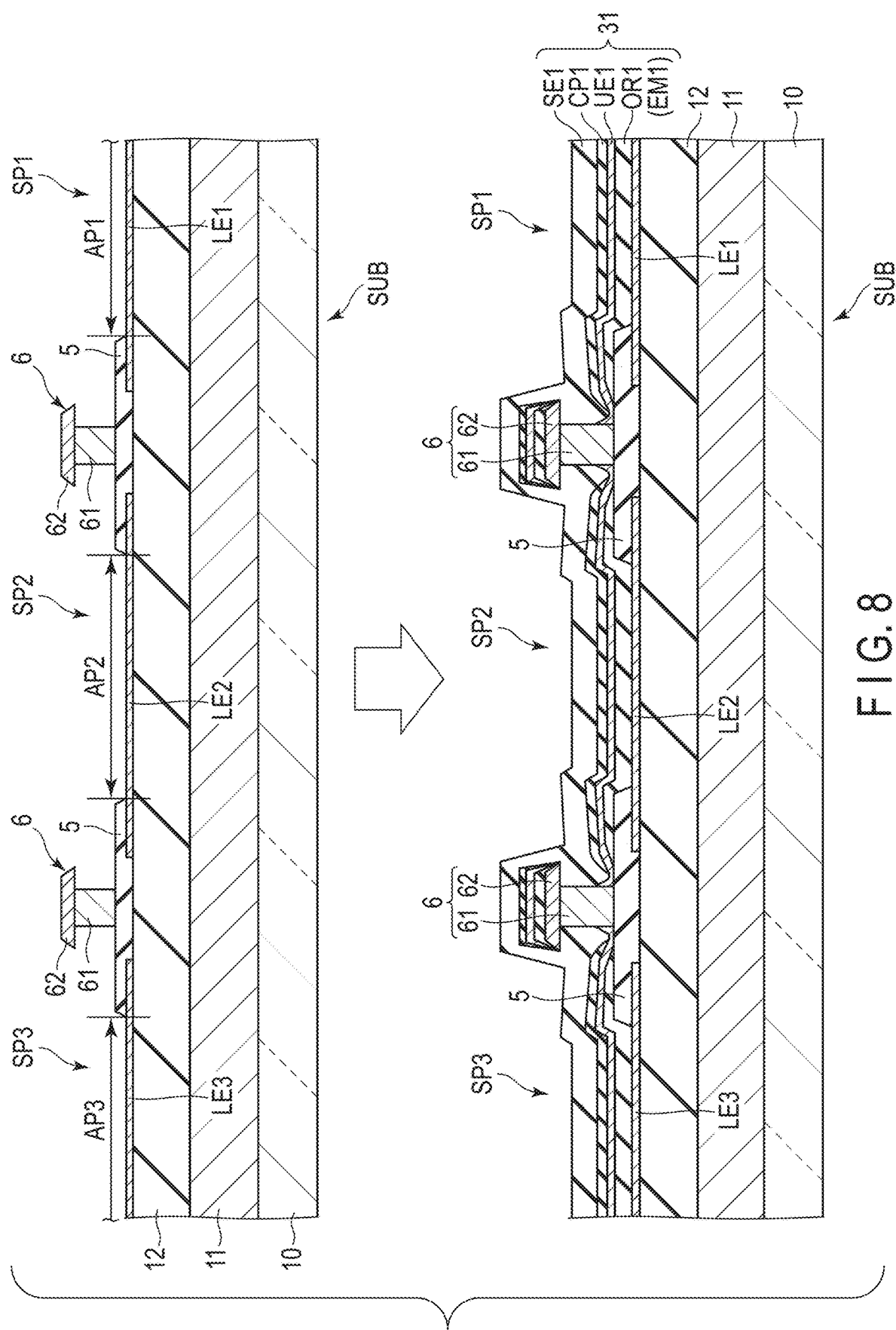
FIG. 8 is a diagram for explaining the method of manufacturing the display device DSP.

As shown in the upper part of FIG. 8, first, in step ST1, the processing substrate SUB is prepared. The process of preparing the processing substrate SUB includes a process of forming the circuit layer 11 on the substrate 10, a process of forming the insulating layer 12 on the circuit layer 11, a process of forming the lower electrode LE1 of the sub-pixel SP1, the lower electrode LE2 of the sub-pixel SP2, and the lower electrode LE3 of the sub-pixel SP3 on the insulating layer 12, a process of forming the rib 5 including the apertures AP1, AP2, and AP3 overlapping the lower electrodes LE1, LE2, and LE3, respectively, and a process of forming the partition 6 including the lower portion 61 disposed on the rib 5 and the upper portion 62 disposed on the lower portion 61 and protruding from the side surface of the lower portion 61. As described above, the area of the aperture AP1 is larger than the area of the aperture AP2, and the area of the aperture AP2 is larger than the area of the aperture AP3. Each of the cross sections shown in FIGS. 8 to 15 corresponds to, for example, a cross section taken along line III-III in FIG. 2, and the magnitude relationship of the areas of the apertures is not reflected in the drawings. In FIGS. 9 to 15, illustration of the substrate 10 and the circuit layer 11 below the insulating layer 12 is omitted.

As shown in the lower part of FIG. 8, subsequently, in step ST21, the first thin film 31 is formed over the sub-pixel SP1, the sub-pixel SP2, and the sub-pixel SP3. The process of forming the first thin film 31 includes a process of forming, on the processing substrate SUB, the organic layer OR1 including the light emitting layer EM1 that emits light in the blue wavelength range, a process of forming the upper electrode UE1 on the organic layer OR1, a process of forming the cap layer CP1 on the upper electrode UE1, and a process of forming the sealing layer SE1 on the cap layer CP1.

The organic layer OR1 is formed on each of the lower electrode LE1, the lower electrode LE2, and the lower electrode LE3, and is also formed on the partition 6. In the organic layer OR1, a part formed on the upper portion 62 is spaced apart from a part formed on each lower electrode.

The upper electrode UE1 is formed on the organic layer OR1 directly above the lower electrode LE1, the lower electrode LE2, and the lower electrode LE3, and is in contact with the lower portion 61 of the partition 6. The upper electrode UE1 is also formed on the organic layer OR1 directly above the upper portion 62. In the upper electrode UE1, a part formed directly above the upper portion 62 is spaced apart from a part formed directly above each lower electrode.

The cap layer CP1 is formed on the upper electrode UE1 directly above the lower electrode LE1, the lower electrode LE2, and the lower electrode LE3, and is also formed on the upper electrode UE1 directly above the upper portion 62. In the cap layer CP1, a part formed directly above the upper portion 62 is spaced apart from a part formed directly above each lower electrode.

The sealing layer SE1 is formed so as to cover the cap layer CP1 and the partition 6. In other words, the sealing layer SE1 is formed on the cap layer CP1 directly above the lower electrode LE1, the lower electrode LE2, and the lower electrode LE3, and is also formed on the cap layer CP1 directly above the upper portion 62. In the sealing layer SE1, a part formed directly above the upper portion 62 is connected to a part formed directly above each lower electrode.

Figure 9:
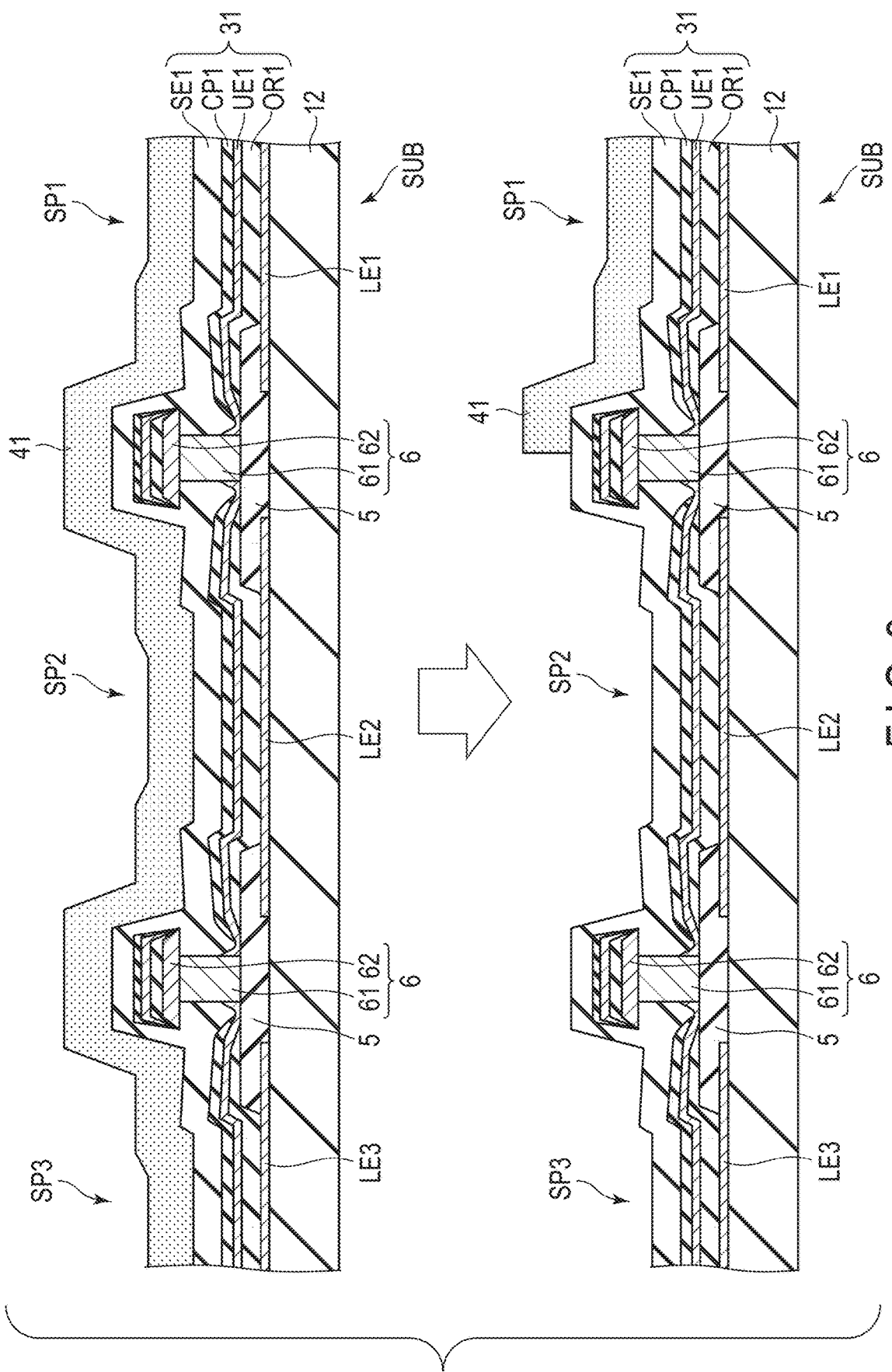
FIG. 9 is a diagram for explaining the method of manufacturing the display device DSP.

As shown in FIG. 9, subsequently, in step ST22, the first resist 41 is formed on the sealing layer SE1. As shown in the upper part of FIG. 9, first, the first resist 41 is applied over the entire surface of the sealing layer SE1. As shown in the lower part of FIG. 9, thereafter, the first resist 41 is patterned. The first resist 41 covers the first thin film 31 in the sub-pixel SP1 and exposes the first thin film 31 in the sub-pixel SP2 and the sub-pixel SP3. In other words, the first resist 41 is disposed directly above the lower electrode LE1. In addition, the first resist 41 extends above the partition 6 from the sub-pixel SP1. On the partition 6 between the sub-pixel SP1 and the sub-pixel SP2, the first resist 41 is disposed on the sub-pixel SP1 side (right side in the drawing), and the sealing layer SE1 is exposed on the sub-pixel SP2 side (left side in the drawing). In addition, the first resist 41 exposes the sealing layer SE1 in the sub-pixel SP2 and the sub-pixel SP3.

Figure 10:
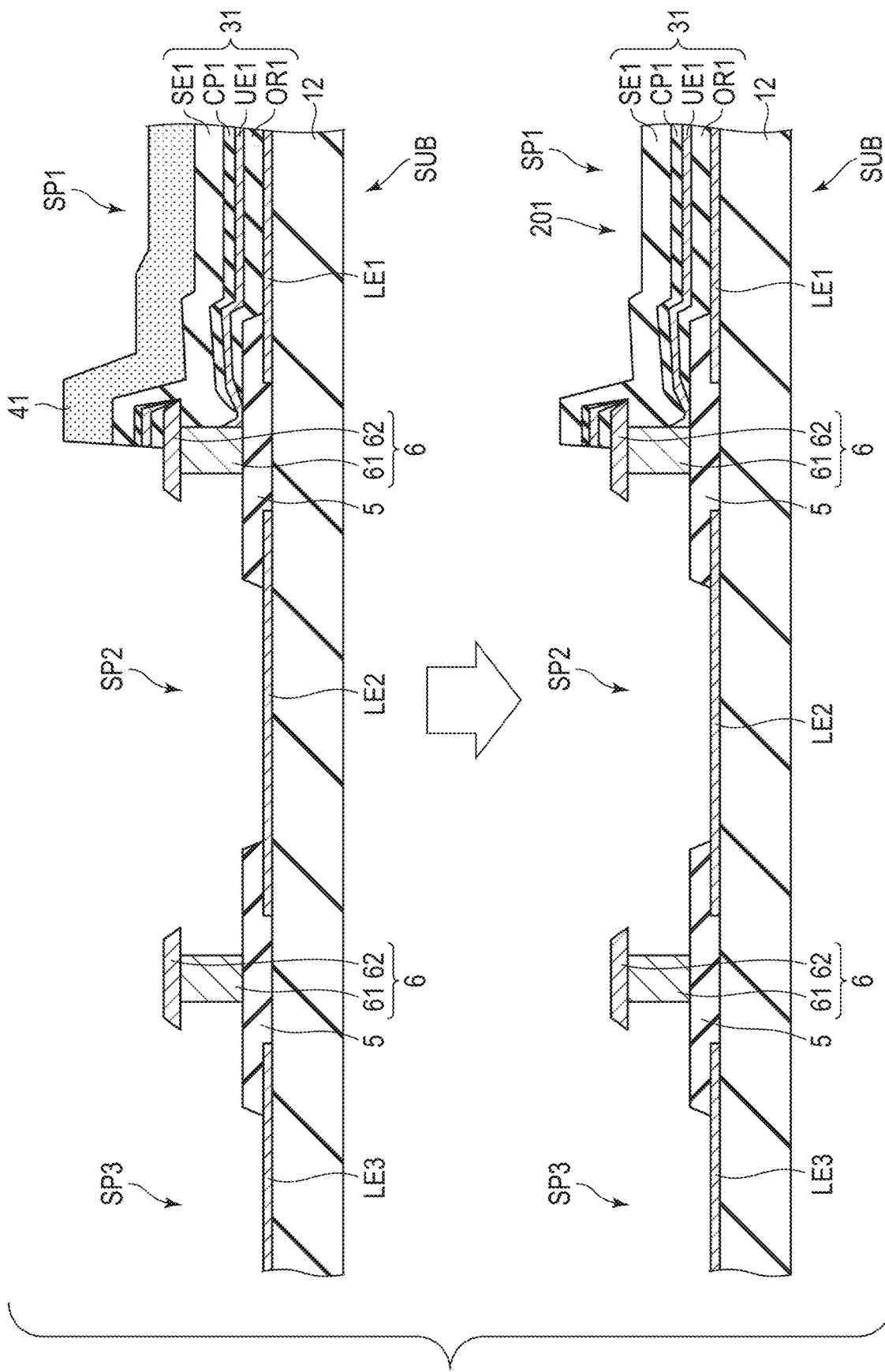
FIG. 10 is a diagram for explaining the method of manufacturing the display device DSP.

As shown in the upper part of FIG. 10, subsequently, in step ST23, etching is performed using the first resist 41 as a mask to remove the first thin film 31 exposed from the first resist 41 in the sub-pixel SP2 and the sub-pixel SP3, and the first thin film 31 remains in the sub-pixel SP1. In other words, the sealing layer SE1, the cap layer CP1, the upper electrode UE1, and the organic layer OR1 in the sub-pixel SP2 and the sub-pixel SP3 are removed. As a result, in the sub-pixel SP2, the lower electrode LE2 is exposed from the aperture AP2, and the rib 5 surrounding the lower electrode LE2 is exposed. In addition, in the sub-pixel SP3, the lower electrode LE3 is exposed from the aperture AP3, and the rib 5 surrounding the lower electrode LE3 is exposed.

In addition, on the partition 6 between the sub-pixel SP1 and the sub-pixel SP2, a portion of the sealing layer SE1, a portion of the cap layer CP1, a portion of the upper electrode UE1, and a portion of the organic layer OR1 are removed. As a result, a part of the partition 6 on the sub-pixel SP2 side is exposed.

In addition, the partition 6 between the sub-pixel SP2 and the sub-pixel SP3 is exposed.

As shown in the lower part of FIG. 10, subsequently, in step ST24, the first resist 41 is removed. As a result, the sealing layer SE1 in the sub-pixel SP1 is exposed. Through these steps ST21 to ST24, the display element 201 is formed in the sub-pixel SP1. The display element 201 includes the lower electrode LE1, the organic layer OR1 including the light emitting layer EM1, the upper electrode UE1, and the cap layer CP1. In addition, the display element 201 is covered with the sealing layer SE1.

On the partition 6 between the sub-pixel SP1 and the sub-pixel SP2, a stacked layer body of the organic layer OR1 including the light emitting layer EM1, the upper electrode UE1, the cap layer CP1, and the sealing layer SE1 is formed. In addition, a part of the partition 6 on the sub-pixel SP1 side is covered with the sealing layer SE1.

Figure 11:
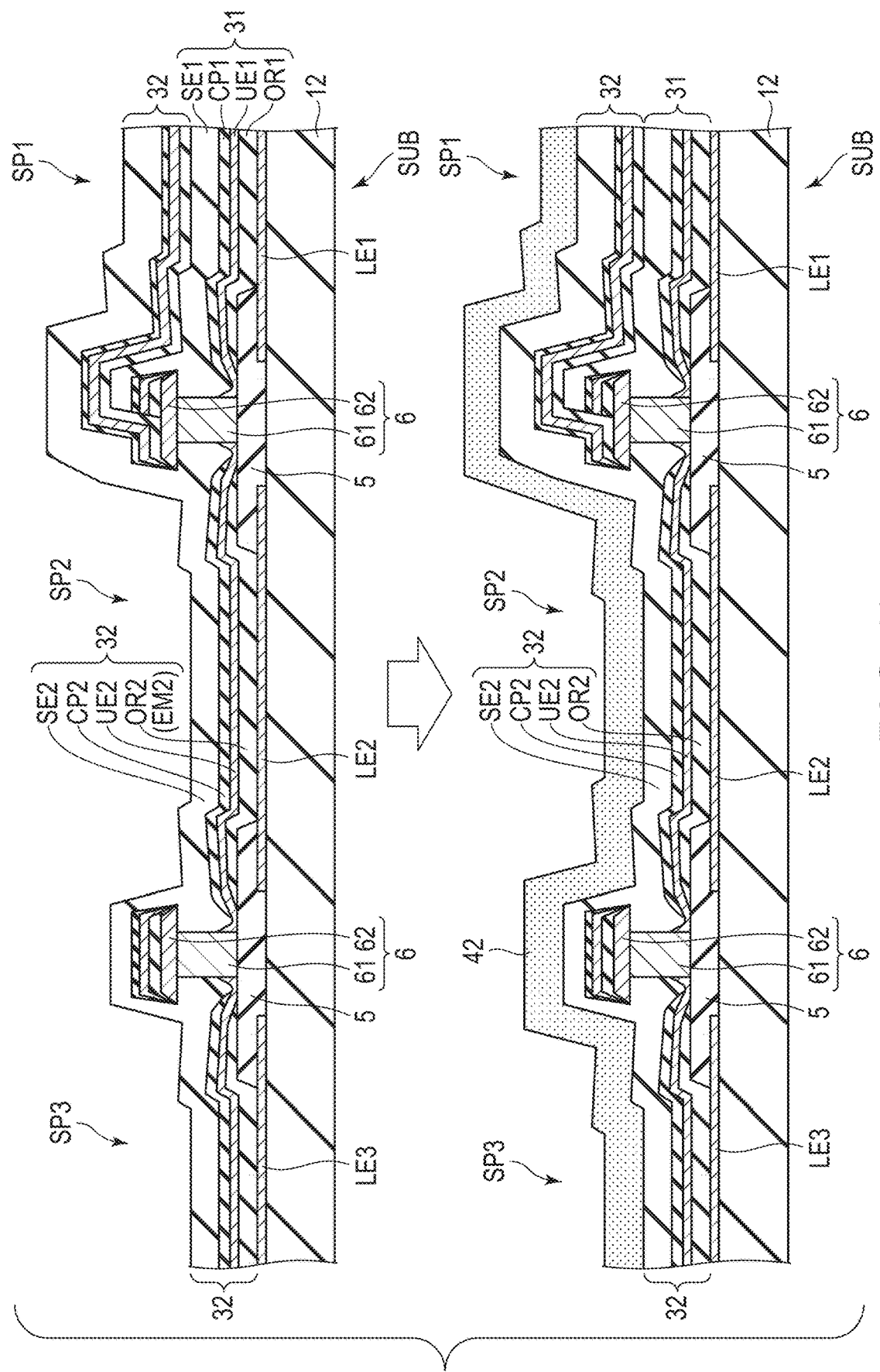
FIG. 11 is a diagram for explaining the method of manufacturing the display device DSP.

As shown in the upper part of FIG. 11, subsequently, in step ST31, the second thin film 32 is formed over the sub-pixel SP1, the sub-pixel SP2, and the sub-pixel SP3. The second thin film 32 covers the first thin film 31 in the sub-pixel SP1. The process of forming the second thin film 32 includes a process of forming, on the processing substrate SUB, the organic layer OR2 including the light emitting layer EM2 that emits light in the green wavelength range, a process of forming the upper electrode UE2 on the organic layer OR2, a process of forming the cap layer CP2 on the upper electrode UE2, and a process of forming the sealing layer SE2 on the cap layer CP2.

The organic layer OR2 is formed on each of the lower electrode LE2 and the lower electrode LE3, and is also formed on the sealing layer SE1 in the sub-pixel SP1. In addition, the organic layer OR2 is also formed on the partition 6. In the organic layer OR2, a part formed on the partition 6 between the sub-pixel SP1 and the sub-pixel SP2 is spaced apart from a part formed directly above the lower electrode LE2. In addition, in the organic layer OR2, a part formed on the partition 6 between the sub-pixel SP2 and the sub-pixel SP3 is spaced apart from a part formed directly above the lower electrode LE2 and a part formed directly above the lower electrode LE3.

The upper electrode UE2 is formed on the organic layer OR2. The upper electrode UE2 formed directly above the lower electrode LE2 and the lower electrode LE3 is in contact with the lower portion 61 of the partition 6. In addition, the upper electrode UE2 is also formed on the organic layer OR2 directly above the upper portion 62.

The cap layer CP2 is formed on the upper electrode UE2 directly above the lower electrode LE1, the lower electrode LE2, and the lower electrode LE3 and directly above the partition 6.

The sealing layer SE2 is formed so as to cover the cap layer CP2 and the partition 6. In other words, the sealing layer SE2 is formed on the cap layer CP2 directly above the lower electrode LE1, the lower electrode LE2, and the lower electrode LE3, and is also formed on the cap layer CP2 directly above the upper portion 62.

Subsequently, in step ST32, the second resist 42 is formed on the sealing layer SE2. As shown in the lower part of FIG. 11, first, the second resist 42 is applied over the entire surface of the sealing layer SE2. As shown in the upper part of FIG. 12, thereafter, the second resist 42 is patterned. The second resist 42 covers the second thin film 32 in the sub-pixel SP2 and exposes the second thin film 32 in the sub-pixel SP1 and the sub-pixel SP3. In other words, the second resist 42 is disposed directly above the lower electrode LE2. In addition, the second resist 42 extends above the partition 6 from the sub-pixel SP2. In addition, the second resist 42 exposes the sealing layer SE2 in the sub-pixel SP1 and the sub-pixel SP3.

Figure 12:
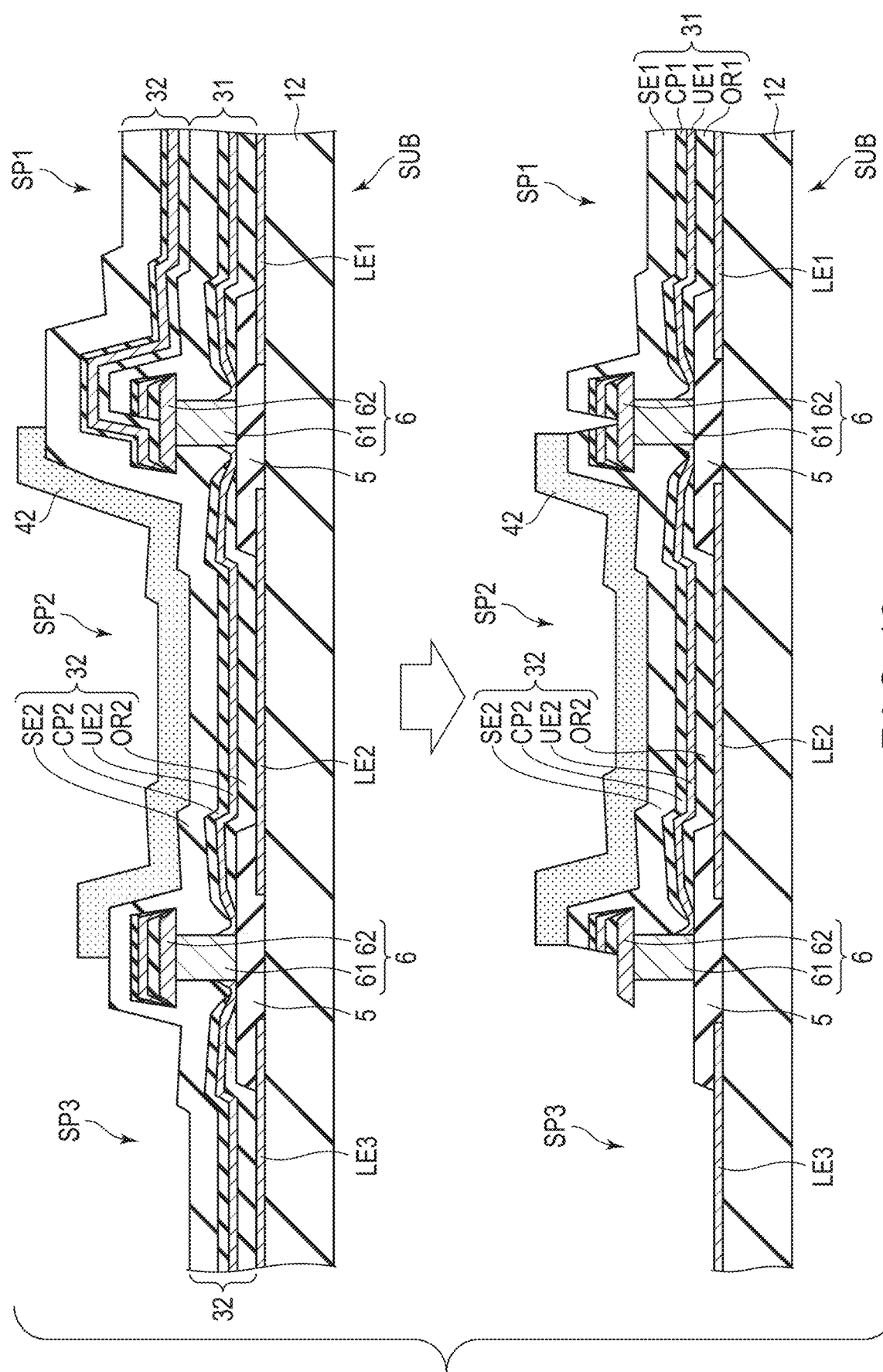
FIG. 12 is a diagram for explaining the method of manufacturing the display device DSP.

As shown in the lower part of FIG. 12, subsequently, in step ST33, etching is performed using the second resist 42 as a mask to remove the second thin film 32 exposed from the second resist 42 in the sub-pixel SP1 and the sub-pixel SP3, and the second thin film 32 remains in the sub-pixel SP2. In other words, the sealing layer SE2, the cap layer CP2, the upper electrode UE2, and the organic layer OR2 in the sub-pixel SP1 and the sub-pixel SP3 are removed. As a result, the sealing layer SE1 in the sub-pixel SP1 is exposed, the lower electrode LE3 is exposed from the aperture AP3 in the sub-pixel SP3, and the rib 5 surrounding the lower electrode LE3 is also exposed.

In addition, on the partition 6 between the sub-pixel SP1 and the sub-pixel SP2, a portion of the sealing layer SE2, a portion of the cap layer CP2, a portion of the upper electrode UE2, and a portion of the organic layer OR2 are removed. The first thin film 31 and the second thin film 32 are separated on the partition 6. In other words, the sealing layer SE2, the cap layer CP2, the upper electrode UE2, and the organic layer OR2 remaining on the partition 6 are spaced apart from the sealing layer SE1, the cap layer CP1, the upper electrode UE1, and the organic layer OR1 remaining on the partition 6.

In addition, on the partition 6 between the sub-pixel SP2 and the sub-pixel SP3, a portion of the sealing layer SE2, a portion of the cap layer CP2, a portion of the upper electrode UE2, and a portion of the organic layer OR2 are removed. As a result, a part of the partition 6 on the sub-pixel SP3 side is exposed.

Figure 13:
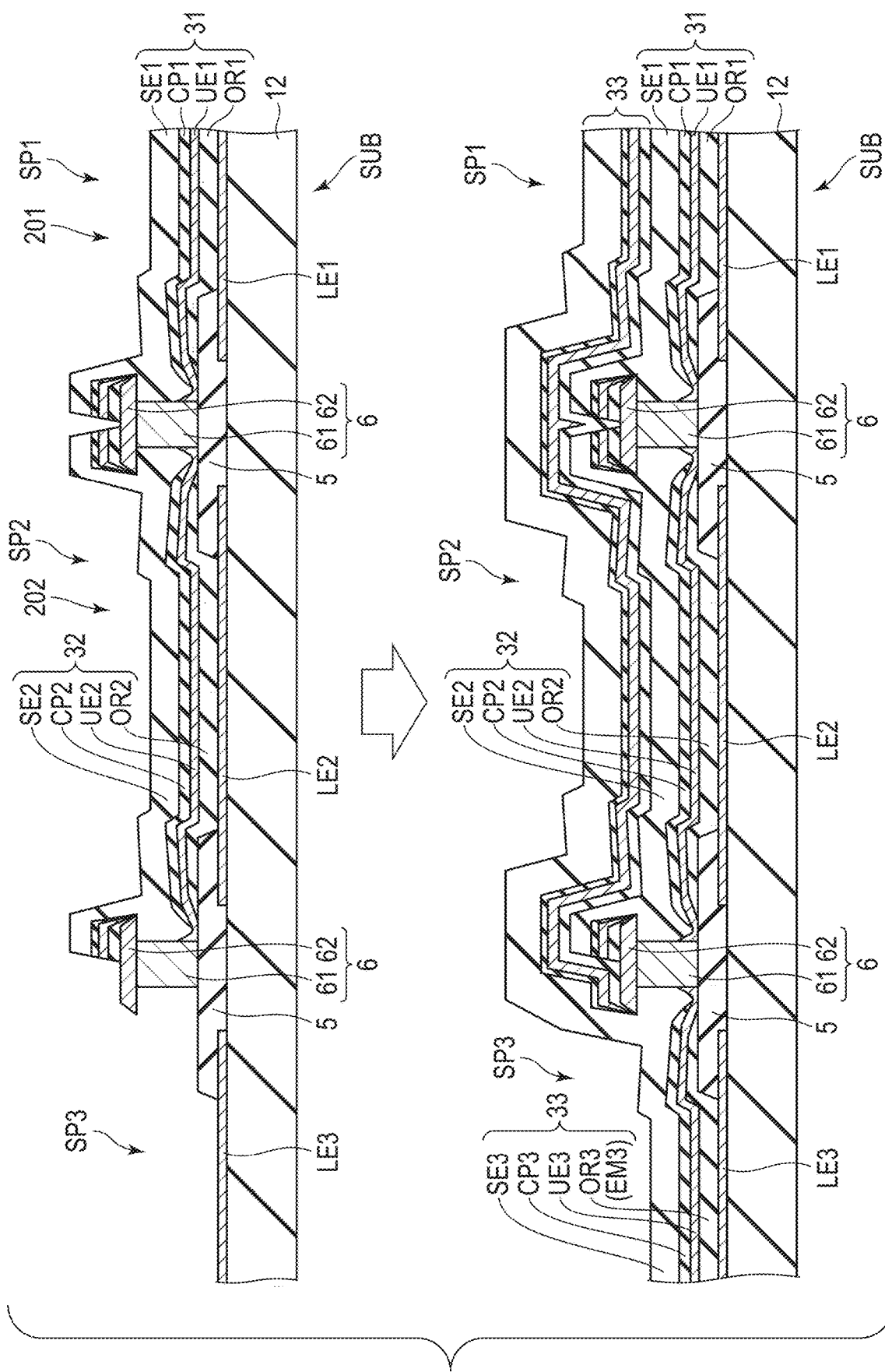
FIG. 13 is a diagram for explaining the method of manufacturing the display device DSP.
Figure 14:
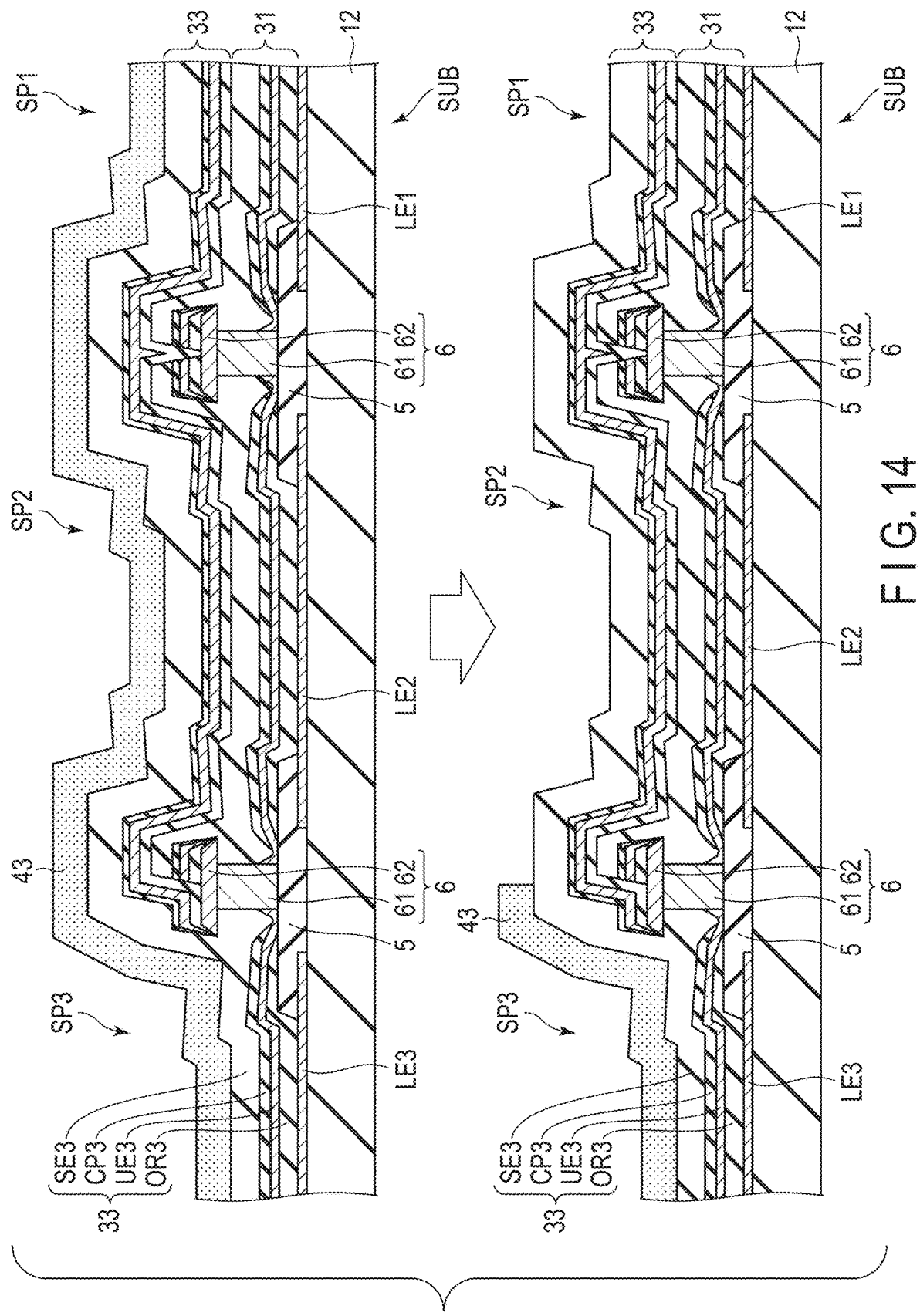
FIG. 14 is a diagram for explaining the method of manufacturing the display device DSP.

As shown in the upper part of FIG. 13, subsequently, in step ST34, the second resist 42 is removed. As a result, the sealing layer SE2 in the sub-pixel SP2 is exposed. Through these steps ST31 to ST34, the display element 202 is formed in the sub-pixel SP2. The display element 202 includes the lower electrode LE2, the organic layer OR2 including the light emitting layer EM2, the upper electrode UE2, and the cap layer CP2. In addition, the display element 202 is covered with the sealing layer SE2.

On the partition 6 between the sub-pixel SP1 and the sub-pixel SP2 and on the partition 6 between the sub-pixel SP2 and the sub-pixel SP3, a stacked layer body of the organic layer OR2 including the light emitting layer EM2, the upper electrode UE2, the cap layer CP2, and the sealing layer SE2 is formed. In addition, a part of the partition 6 on the sub-pixel SP2 side is covered with the sealing layer SE2.

As shown in the lower part of FIG. 13, subsequently, in step ST41, the third thin film 33 is formed over the sub-pixel SP1, the sub-pixel SP2, and the sub-pixel SP3. The third thin film 33 covers the first thin film 31 in the sub-pixel SP1 and covers the second thin film 32 in the sub-pixel SP2. The process of forming the third thin film 33 includes a process of forming, on the processing substrate SUB, the organic layer OR3 including the light emitting layer EM3 that emits light in the red wavelength range, a process of forming the upper electrode UE3 on the organic layer OR3, a process of forming the cap layer CP3 on the upper electrode UE3, and a process of forming the sealing layer SE3 on the cap layer CP3.

The organic layer OR3 is formed on the lower electrode LE3, is also formed on the sealing layer SE1 in the sub-pixel SP1, and is also formed on the sealing layer SE2 in the sub-pixel SP2. In addition, the organic layer OR3 is also formed on the partition 6. On the partition 6 between the sub-pixel SP1 and the sub-pixel SP2, the organic layer OR3 covers the first thin film 31 and the second thin film 32. In the organic layer OR3, a part formed on the partition 6 between the sub-pixel SP2 and the sub-pixel SP3 is spaced apart from a part formed on the lower electrode LE3.

The upper electrode UE3 is formed on the organic layer OR3. The upper electrode UE3 formed directly above the lower electrode LE3 is in contact with the lower portion 61 of the partition 6. In addition, the upper electrode UE3 is also formed on the organic layer OR3 directly above the upper portion 62.

The cap layer CP3 is formed on the upper electrode UE3 directly above the lower electrode LE1, the lower electrode LE2, and the lower electrode LE3 and directly above the partition 6.

The sealing layer SE3 is formed so as to cover the cap layer CP3 and the partition 6. In other words, the sealing layer SE3 is formed on the cap layer CP3 directly above the lower electrode LE1, the lower electrode LE2, and the lower electrode LE3, and is also formed on the cap layer CP3 directly above the upper portion 62.

Subsequently, in step ST42, the third resist 43 is formed on the sealing layer SE3. As shown in the upper part of FIG. 14, first, the third resist 43 is applied over the entire surface of the sealing layer SE3. As shown in the lower part of FIG. 14, thereafter, the third resist 43 is patterned. The third resist 43 covers the third thin film 33 in the sub-pixel SP3 and exposes the third thin film 33 in the sub-pixel SP1 and the sub-pixel SP2. In other words, the third resist 43 is disposed directly above the lower electrode LE3. In addition, the third resist 43 extends above the partition 6 from the sub-pixel SP3. In addition, the third resist 43 exposes the sealing layer SE3 in the sub-pixel SP1 and the sub-pixel SP2.

Figure 15:
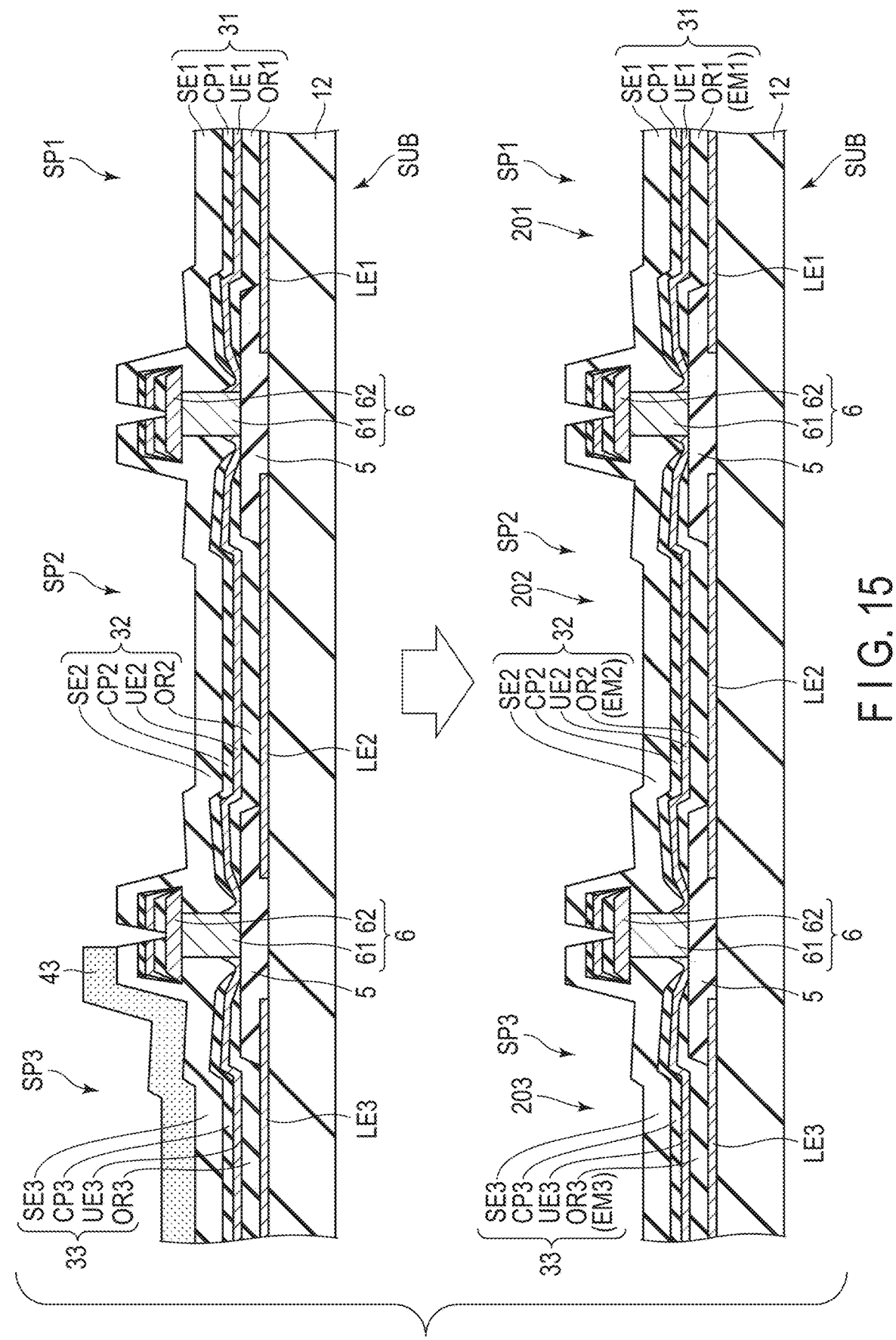
FIG. 15 is a diagram for explaining the method of manufacturing the display device DSP.

As shown in the upper part of FIG. 15, subsequently, in step ST43, etching is performed using the third resist 43 as a mask to remove the third thin film 33 exposed from the third resist 43 in the sub-pixel SP1 and the sub-pixel SP2, and the third thin film 33 remains in the sub-pixel SP3. In other words, the sealing layer SE3, the cap layer CP3, the upper electrode UE3, and the organic layer OR3 in the sub-pixel SP1 and the sub-pixel SP2 are removed. As a result, the sealing layer SE1 in the sub-pixel SP1 is exposed, and the sealing layer SE2 in the sub-pixel SP2 is exposed.

In addition, the sealing layer SE3, the cap layer CP3, the upper electrode UE3, and the organic layer OR3 are removed on the partition 6 between the sub-pixel SP1 and the sub-pixel SP2.

In addition, on the partition 6 between the sub-pixel SP2 and the sub-pixel SP3, a portion of the sealing layer SE3, a portion of the cap layer CP3, a portion of the upper electrode UE3, and a portion of the organic layer OR3 are removed. The second thin film 32 and the third thin film 33 are separated on the partition 6.

As shown in the lower part of FIG. 15, subsequently, in step ST44, the third resist 43 is removed. As a result, the sealing layer SE3 in the sub-pixel SP3 is exposed. Through these steps ST41 to ST44, the display element 203 is formed in the sub-pixel SP3. The display element 203 includes the lower electrode LE3, the organic layer OR3 including the light emitting layer EM3, the upper electrode UE3, and the cap layer CP3. In addition, the display element 203 is covered with the sealing layer SE3.

On the partition 6 between the sub-pixel SP2 and the sub-pixel SP3, a stacked layer body of the organic layer OR3 including the light emitting layer EM3, the upper electrode UE3, the cap layer CP3, and the sealing layer SE3 is formed.

Through the above processes, the display element 201 is formed in the sub-pixel SP1, the display element 202 is formed in the sub-pixel SP2, and the display element 203 is formed in the sub-pixel SP3.

Incidentally, among the above processes, in the process of forming the second thin film 32 in step ST31, the light emitting layer EM2 may be formed of a material that emits light in the red wavelength range, and in the process of forming the third thin film 33 in step ST41, the light emitting layer EM3 may be formed of a material that emits light in the green wavelength range.

In the above example, the sub-pixel SP1 corresponds to a first sub-pixel, the aperture AP1 corresponds to a first aperture, the lower electrode LE1 corresponds to a first lower electrode, the organic layer OR1 corresponds to a first organic layer, the light emitting layer EM1 corresponds to a first light emitting layer, the upper electrode UE1 corresponds to a first upper electrode, the cap layer CP1 corresponds to a first cap layer, and the sealing layer SE1 corresponds to a first sealing layer.

In addition, the sub-pixel SP2 corresponds to a second sub-pixel, the aperture AP2 corresponds to a second aperture, the lower electrode LE2 corresponds to a second lower electrode, the organic layer OR2 corresponds to a second organic layer, the light emitting layer EM2 corresponds to a second light emitting layer, the upper electrode UE2 corresponds to a second upper electrode, the cap layer CP2 corresponds to a second cap layer, and the sealing layer SE2 corresponds to a second sealing layer.

In addition, the sub-pixel SP3 corresponds to a third sub-pixel, the aperture AP3 corresponds to a third aperture, the lower electrode LE3 corresponds to a third lower electrode, the organic layer OR3 corresponds to a third organic layer, the light emitting layer EM3 corresponds to a third light emitting layer, the upper electrode UE3 corresponds to a third upper electrode, the cap layer CP3 corresponds to a third cap layer, and the sealing layer SE3 corresponds to a third sealing layer.

According to the present embodiment, in the pixel PX, the sub-pixel SP1 having the largest aperture area is first formed. As a result, the organic layer OR1 containing a sensitive material is formed on the lower electrode LE1 that is least damaged by etching and has a surface in good condition. The organic layer OR1 is protected by the upper electrode UE1, the cap layer CP1, and the sealing layer SE1. For this reason, the organic layer OR1 is not damaged in the subsequent etching process, and the organic layer OR1 can be maintained in a good quality state.

In addition, in the pixel PX, the sub-pixel SP3 having the smallest aperture area is formed last. As a result, the organic layer OR3 containing a material that is hardly affected by process variation is formed on the lower electrode LE3 that is most damaged by etching during the manufacturing process.

Therefore, defects such as early significant degradation of any one of the organic layer OR1, the organic layer OR2, and the organic layer OR3, a decrease in luminance, a decrease in lifetime, and a change in color chromaticity due to an adverse effect during the manufacturing process are suppressed.

As described above, according to the present embodiment, it is possible to provide a method of manufacturing a display device which can prevent a decrease in reliability and improving a manufacturing yield.

All of the display devices and manufacturing methods thereof that can be implemented by a person of ordinary skill in the art through arbitrary design changes to the display device and manufacturing method thereof described above as the embodiment of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiment by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiment and are self-explanatory from the descriptions of the specification or can be arbitrarily conceived by a person of ordinary skill in the art are considered as the effects of the present invention as a matter of course.

What is claimed is:

1. A method of manufacturing a display device, the method comprising:
   preparing a processing substrate by forming a first lower electrode of a first sub-pixel, a second lower electrode of a second sub-pixel, and a third lower electrode of a third sub-pixel, by forming a rib having a first aperture overlapping the first lower electrode, a second aperture overlapping the second lower electrode, and a third aperture overlapping the third lower electrode, and by forming a partition including a lower portion located on the rib and an upper portion located on the lower portion and protruding from a side surface of the lower portion;
   after the preparing the processing substrate, forming a first thin film over the first sub-pixel, the second sub-pixel, and the third sub-pixel, the first thin film including a first light emitting layer above the first lower electrode, the second lower electrode and the third lower electrode, and the first thin film including a first sealing layer above the first light emitting layer;
   after the forming the first thin film, forming a first resist on the first sealing layer, the first resist exposing the first thin film over the second sub-pixel and the third sub-pixel and covering the first thin film over the first sub-pixel;
   after the forming the first resist, removing the first thin film over the second sub-pixel and the third sub-pixel by etching using the first resist as a mask, remaining the first thin film over the first sub-pixel, exposing the second lower electrode from the second aperture, and exposing the third lower electrode from the third aperture;
   after the removing the first thin film, removing the first resist;
   after the removing the first resist, forming a second thin film over the first sub-pixel, the second sub-pixel, and the third sub-pixel, the second thin film including a second light emitting layer above the first lower electrode, the second lower electrode and the third lower electrode, and the second thin film including a second sealing layer above the second light emitting layer;
   after the forming the second thin film, forming a second resist on the second sealing layer, the second resist exposing the second thin film over the first sub-pixel and the third sub-pixel and covering the second thin film over the second sub-pixel;
   after the forming the second resist, removing the second thin film over the first sub-pixel and the third sub-pixel by etching using the second resist as a mask, remaining the second thin film over the second sub-pixel, and exposing the third lower electrode from the third aperture; and
   after the removing the second thin film, removing the second resist, wherein
   an area of the first aperture is larger than an area of the second aperture.

2. The method of manufacturing a display device according to claim 1, wherein
   after the preparing the processing substrate and before the forming the first thin film, no film is formed over the first lower electrode.

3. The method of manufacturing a display device according to claim 2, wherein
   after the preparing the processing substrate and before the forming the first thin film, no film is formed over the second lower electrode.

4. The method of manufacturing a display device according to claim 3, wherein
   after the preparing the processing substrate and before the forming the first thin film, no film is formed over the third lower electrode.

5. The method of manufacturing a display device according to claim 1, wherein
   after the preparing the processing substrate and before the forming the first thin film, no etching process is performed to the first sub-pixel.

6. The method of manufacturing a display device according to claim 5, wherein
   after the preparing the processing substrate and before the forming the first thin film, no etching process is performed to the second sub-pixel.

7. The method of manufacturing a display device according to claim 6, wherein
   after the preparing the processing substrate and before the forming the first thin film, no etching process is performed to the third sub-pixel.

8. The method of manufacturing a display device according to claim 1, wherein
   after the preparing the processing substrate, the first thin film is formed directly on the first lower electrode.

9. A method of manufacturing a display device, the method comprising:
   preparing a processing substrate by forming a first lower electrode of a first sub-pixel, a second lower electrode of a second sub-pixel, and a third lower electrode of a third sub-pixel, by forming a rib having a first aperture overlapping the first lower electrode, a second aperture overlapping the second lower electrode, and a third aperture overlapping the third lower electrode, and by forming a partition including a lower portion located on the rib and an upper portion located on the lower portion and protruding from a side surface of the lower portion;
   after the preparing the processing substrate, forming a first thin film over the first sub-pixel, the second sub-pixel, and the third sub-pixel, the first thin film including a first light emitting layer above the first lower electrode, the second lower electrode and the third lower electrode, and the first thin film including a first sealing layer above the first light emitting layer;
   after the forming the first thin film, forming a first resist on the first sealing layer, the first resist exposing the first thin film over the second sub-pixel and the third sub-pixel and covering the first thin film over the first sub-pixel;
   after the forming the first resist, with the first resist remaining on the first thin film over the first sub-pixel, removing the first thin film over the second sub-pixel and the third sub-pixel by etching using the first resist as a mask, remaining the first thin film over the first sub-pixel not to expose the first lower electrode from the first aperture, exposing the second lower electrode from the second aperture, and exposing the third lower electrode from the third aperture;
   after the removing the first thin film, removing the first resist;
   after the removing the first resist, forming a second thin film over the first sub-pixel, the second sub-pixel, and the third sub-pixel, the second thin film including a second light emitting layer above the first lower electrode, the second lower electrode and the third lower electrode, and the second thin film including a second sealing layer above the second light emitting layer;

after the forming the second thin film, forming a second resist on the second sealing layer, the second resist exposing the second thin film over the first sub-pixel and the third sub-pixel and covering the second thin film in the second sub-pixel;

after the forming the second resist, with the second resist remaining on the second thin film over the second sub-pixel, removing the second thin film over the first sub-pixel and the third sub-pixel by etching using the second resist as a mask, remaining the second thin film over the second sub-pixel not to expose the first lower electrode from the first aperture and not to expose the second lower electrode from the second aperture, and exposing the third lower electrode from the third aperture; and after the removing the second thin film, removing the second resist, wherein an area of the first aperture is larger than an area of the second aperture.

10. The method of manufacturing a display device according to claim 9, wherein after the preparing the processing substrate and before the forming the first thin film, no film is formed over the first lower electrode, and no etching process is performed to the first sub-pixel.

11. The method of manufacturing a display device according to claim 10, wherein after the preparing the processing substrate and before the forming the first thin film, no film is formed over the second lower electrode, and no etching process is performed to the second sub-pixel.

12. The method of manufacturing a display device according to claim 11, wherein after the preparing the processing substrate and before the forming the first thin film, no film is formed over the third lower electrode, and no etching process is performed to the third sub-pixel.

13. The method of manufacturing a display device according to claim 9, wherein after the preparing the processing substrate, the first thin film is formed directly on the first lower electrode.

14. A method of manufacturing a display device, the method comprising:

preparing a processing substrate by forming a first lower electrode of a first sub-pixel, a second lower electrode of a second sub-pixel, and a third lower electrode of a third sub-pixel, by forming a rib having a first aperture overlapping the first lower electrode, a second aperture overlapping the second lower electrode, and a third aperture overlapping the third lower electrode, and by forming a partition including a lower portion located on the rib and an upper portion located on the lower portion and protruding from a side surface of the lower portion;

after the preparing the processing substrate, forming a first thin film over the first sub-pixel, the second sub-pixel, and the third sub-pixel, the first thin film including a first light emitting layer above the first lower electrode, the second lower electrode and the third lower electrode, and the first thin film including a first sealing layer above the first light emitting layer;

after the forming the first thin film, forming a first resist on the first sealing layer, the first resist exposing the first thin film over the second sub-pixel and the third sub-pixel and covering the first thin film over the first sub-pixel;

after the forming the first resist, removing the first thin film over the second sub-pixel and the third sub-pixel by etching using the first resist as a mask, remaining the first thin film over the first sub-pixel, exposing the second lower electrode from the second aperture, and exposing the third lower electrode from the third aperture;

after the removing the first thin film, removing the first resist;

after the removing the first resist, forming a second thin film on the first sealing layer of the first sub-pixel, on the second lower electrode of the second sub-pixel, and on the third lower electrode of the third sub-pixel, the second thin film including a second light emitting layer above the first lower electrode, the second lower electrode and the third lower electrode, and the second thin film including a second sealing layer above the second light emitting layer;

after the forming the second thin film, forming a second resist on the second sealing layer, the second resist exposing the second thin film over the first sub-pixel and the third sub-pixel and covering the second thin film over the second sub-pixel;

after the forming the second resist, removing the second thin film over the first sub-pixel and the third sub-pixel by etching using the second resist as a mask, remaining the second thin film over the second sub-pixel, exposing the first sealing layer over the first sub-pixel, and exposing the third lower electrode from the third aperture; and after the removing the second thin film, removing the second resist, wherein an area of the first aperture is larger than an area of the second aperture.

15. The method of manufacturing a display device according to claim 14, wherein after the preparing the processing substrate and before the forming the first thin film, no film is formed over the first lower electrode, and no etching process is performed to the first sub-pixel.

16. The method of manufacturing a display device according to claim 15, wherein after the preparing the processing substrate and before the forming the first thin film, no film is formed over the second lower electrode, and no etching process is performed to the second sub-pixel.

17. The method of manufacturing a display device according to claim 16, wherein after the preparing the processing substrate and before the forming the first thin film, no film is formed over the third lower electrode, and no etching process is performed to the third sub-pixel.

18. The method of manufacturing a display device according to claim 14, wherein after the preparing the processing substrate, the first thin film is formed directly on the first lower electrode.

* * * * *